(12) United States Patent
Choi et al.

(10) Patent No.: US 12,160,966 B2
(45) Date of Patent: Dec. 3, 2024

(54) DISPLAY APPARATUS AND CONTROL METHOD THEREOF

(71) Applicant: Samsung Electronics Co., Ltd., Suwon-si (KR)

(72) Inventors: Eunseok Choi, Suwon-si (KR); Joonhyun Yang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 746 days.

(21) Appl. No.: 17/073,681

(22) Filed: Oct. 19, 2020

(65) Prior Publication Data
US 2021/0249980 A1    Aug. 12, 2021

(30) Foreign Application Priority Data

Feb. 6, 2020    (KR) .................. 10-2020-0014089

(51) Int. Cl.
| | | |
|---|---|---|
| *H05K 5/02* | (2006.01) | |
| *G01P 15/18* | (2013.01) | |
| *G06F 3/0484* | (2022.01) | |
| *H05K 5/00* | (2006.01) | |

(52) U.S. Cl.
CPC ............ *H05K 5/0234* (2013.01); *G01P 15/18* (2013.01); *H05K 5/0017* (2013.01); *G06F 3/0484* (2013.01)

(58) Field of Classification Search
CPC ...... F16M 11/18; F16M 13/027; F16M 11/10; H05K 5/0234; H05K 5/0017; G06F 3/0484
See application file for complete search history.

(56) References Cited

U.S. PATENT DOCUMENTS

| | | |
|---|---|---|
| 6,897,882 B1 | 5/2005 | Kim |
| 7,023,499 B2 | 4/2006 | Williams et al. |
| 7,304,838 B2 | 12/2007 | Kumano et al. |
| 7,499,267 B2 | 3/2009 | Kumano et al. |
| 8,023,049 B2 | 9/2011 | Ueno |
| 8,553,149 B2 | 10/2013 | Ansfield |
| 8,991,951 B2 | 3/2015 | Lee et al. |

(Continued)

FOREIGN PATENT DOCUMENTS

| | | |
|---|---|---|
| CN | 1921023 | 2/2007 |
| CN | 201282523 Y | 7/2009 |

(Continued)

OTHER PUBLICATIONS

Office Action dated Feb. 24, 2023 in U.S. Appl. No. 17/137,619 (41 pages).

(Continued)

*Primary Examiner* — Said Bouziane
(74) *Attorney, Agent, or Firm* — STAAS & HALSEY LLP

(57) ABSTRACT

A display apparatus and a control method thereof are provided. The display apparatus includes a display, a motor, a sensor, and a processor configured to receive a signal including information on acceleration of the display apparatus from the sensor while the display is rotated by the motor, identify the size of the acceleration of the display apparatus based on the information on the acceleration, and based on identifying that the display collided with an object based on the size of the acceleration of the display apparatus, control the motor to stop the rotation of the display.

16 Claims, 24 Drawing Sheets

(56) References Cited

U.S. PATENT DOCUMENTS

| | | | |
|---|---|---|---|
| 9,628,744 | B2 | 4/2017 | Phang |
| 10,083,551 | B1* | 9/2018 | Schmitt .................. G07C 5/085 |
| 10,228,766 | B2 | 3/2019 | Bhesania et al. |
| 10,587,903 | B2 | 3/2020 | Park et al. |
| 2003/0202003 | A1 | 10/2003 | Marmaropoulos |
| 2005/0276164 | A1 | 12/2005 | Amron |
| 2006/0290687 | A1 | 12/2006 | Takaji et al. |
| 2007/0047187 | A1 | 3/2007 | Kumano et al. |
| 2007/0056697 | A1 | 3/2007 | Chen |
| 2008/0055835 | A1 | 3/2008 | Kumano et al. |
| 2008/0117342 | A1 | 5/2008 | Ueno |
| 2008/0136610 | A1 | 6/2008 | Limin et al. |
| 2008/0316689 | A1 | 12/2008 | Moscovitch |
| 2009/0225239 | A1 | 9/2009 | Osada et al. |
| 2009/0272870 | A1 | 11/2009 | Asakura |
| 2010/0014238 | A1 | 1/2010 | Zende |
| 2010/0061041 | A1 | 3/2010 | Chen |
| 2010/0149438 | A1 | 6/2010 | Chen |
| 2010/0248796 | A1 | 9/2010 | Higashigawa |
| 2011/0037866 | A1 | 2/2011 | Iwamoto |
| 2011/0079685 | A1 | 4/2011 | Kwak |
| 2011/0253866 | A1* | 10/2011 | Maeda .................. F16M 11/18 73/514.01 |
| 2012/0067149 | A1 | 3/2012 | Yoon et al. |
| 2012/0158187 | A1 | 6/2012 | Shin |
| 2012/0175480 | A1 | 7/2012 | Lee |
| 2012/0300134 | A1 | 11/2012 | Slowinski et al. |
| 2013/0026889 | A1 | 1/2013 | Lee et al. |
| 2014/0192271 | A1 | 7/2014 | Westerink |
| 2015/0172567 | A1 | 6/2015 | Ekeroth |
| 2015/0192929 | A1 | 7/2015 | Rihn et al. |
| 2015/0248157 | A9 | 9/2015 | Touma et al. |
| 2016/0129595 | A1 | 5/2016 | Gerio et al. |
| 2016/0202089 | A1 | 7/2016 | Leoncavallo et al. |
| 2016/0267887 | A1 | 9/2016 | Noda |
| 2017/0038845 | A1 | 2/2017 | Chi |
| 2017/0218676 | A1 | 8/2017 | Kitou |
| 2017/0331986 | A1* | 11/2017 | Houba ................. H04N 23/698 |
| 2018/0240252 | A1 | 8/2018 | Lee |
| 2019/0050964 | A1 | 2/2019 | Jang et al. |
| 2019/0193644 | A1 | 6/2019 | Amano et al. |
| 2019/0317549 | A1 | 10/2019 | Gurr et al. |
| 2019/0333479 | A1 | 10/2019 | Maalouf et al. |
| 2020/0026419 | A1 | 1/2020 | Jang et al. |
| 2020/0050185 | A1 | 2/2020 | Shimotsuma |
| 2020/0225696 | A1 | 7/2020 | Patel et al. |
| 2020/0292924 | A1 | 9/2020 | Amano et al. |
| 2020/0344439 | A1 | 10/2020 | Choi et al. |
| 2020/0367646 | A1 | 11/2020 | Cho |
| 2021/0049984 | A1 | 2/2021 | Cain |
| 2021/0214989 | A1 | 7/2021 | Linden et al. |

FOREIGN PATENT DOCUMENTS

| | | |
|---|---|---|
| CN | 103323517 | 12/2015 |
| CN | 106601171 A | 4/2017 |
| CN | 108766232 | 11/2018 |
| CN | 108953911 | 12/2018 |
| CN | 111853480 | 10/2020 |
| EP | 1821173 | 8/2007 |
| EP | 3730831 | 10/2020 |
| JP | 2005-109626 | 4/2005 |
| JP | 2007-295379 | 11/2007 |
| JP | 4259971 | 4/2009 |
| JP | 2013-211714 A1 | 10/2013 |
| KR | 10-2006-0121368 | 11/2006 |
| KR | 10-0803750 | 2/2008 |
| KR | 10-0813514 | 3/2008 |
| KR | 10-2008-0057019 | 6/2008 |
| KR | 10-2008-0057046 | 6/2008 |
| KR | 10-0860301 | 9/2008 |
| KR | 10-2010-0045374 | 5/2010 |
| KR | 10-0961772 | 6/2010 |
| KR | 10-0985223 | 10/2010 |
| KR | 10-2011-0038559 | 4/2011 |
| KR | 10-2011-0075887 | 7/2011 |
| KR | 10-1276244 | 6/2013 |
| KR | 10-2014-0008796 | 1/2014 |
| KR | 10-1766821 | 8/2017 |
| KR | 10-2017-0118318 | 10/2017 |
| KR | 10-2018-0057473 | 5/2018 |
| KR | 10-2019-0017614 | 2/2019 |
| KR | 10-2143083 | 8/2020 |
| KR | 10-2020-0134869 | 12/2020 |
| WO | 01/28822 | 4/2001 |
| WO | 2020/218687 | 10/2020 |

OTHER PUBLICATIONS

Extended European Search Report dated Apr. 29, 2020 in European Patent Application No. 19200605.4.
Korean Notice of Allowance dated May 28, 2020 in Korean Patent Application No. 10-2019-0109420.
International Search Report and Written Opinion of the International Searching Authority dated Jan. 31, 2020 in International Patent Application No. PCT/KR2019/012700.
Korean Office Action dated Jan. 20, 2020 in Korean Patent Application No. 10-2019-0109420.
US Notice of Allowance dated Apr. 6, 2020 in U.S. Appl. No. 16/587,661.
US Notice of Withdraw from Issue dated May 11, 2020 in U.S. Appl. No. 16/587,661.
U.S. Appl. No. 16/587,661, filed Sep. 30, 2019, Eunseok Choi, Samsung Electronics Co., Ltd.
Notice of Allowance dated Nov. 1, 2022 in U.S. Appl. No. 16/587,661 (15 pages).
Final Office Action dated Dec. 1, 2022 in U.S. Appl. No. 17/137,619 (43 pages).
Office Action dated Jun. 15, 2022 in U.S. Appl. No. 16/587,661 (70 pages).
Office Action dated Jun. 8, 2022 in U.S. Appl. No. 17/137,619 (57 pages).
Japanese Office Action for Japanese Patent Application No. 2021-536706 dated Nov. 9, 2021.
Chinese Office Action dated Apr. 30, 2021 in Chinese Patent Application No. 201910857957.0.
International Search Report and Written Opinion of the International Searching Authority dated Mar. 9, 2021 in International Patent Application No. PCT/KR2020/016337.
International Search Report and Written Opinion of the International Searching Authority dated May 20, 2021 in International Patent Application No. PCT/KR2021/001391.
Indian Office Action issued Mar. 4, 2022 in Indian Patent Application No. 202117024197 (6 pages).
Office Action dated Apr. 29, 2024 for corresponding Korean patent application No. 10-2020-0014089.
Office Action dated Aug. 14, 2023 in U.S. Appl. No. 17/137,619.

* cited by examiner

DISPLAY APPARATUS AND CONTROL METHOD THEREOF

CROSS-REFERENCE TO RELATED APPLICATION(S)

This application is based on and claims priority under 35 U.S.C. § 119 (a) of a Korean patent application number 10-2020-0014089, filed on Feb. 6, 2020 in the Korean Intellectual Property Office, the disclosure of which is incorporated by reference herein in its entirety.

BACKGROUND

1. Field

The disclosure relates to a display apparatus and a control method thereof, and more particularly, to a display apparatus which includes a rotatable display and a control method thereof.

2. Description of Related Art

Recently, with the development of electronic technologies, various electronic apparatuses are being developed. In particular, recently, a display apparatus including a rotatable display is being developed.

A rotatable display apparatus may, if a user instruction for rotation is input, rotate a display arranged in a horizontal state to a vertical state, or rotate a display arranged in a vertical state to a horizontal state.

Meanwhile, in case a display rotates while a person or an object is located within the rotating radius of the display, the display may collide with the person or the object.

In this case, it is necessary to stop the rotation of the display. This is because, i f the display keeps rotating after collision, there is a risk that a user who collided with the dis play may be injured, and there is also a risk that the display or an object that collided with the display may be broken.

SUMMARY

A display apparatus according to an embodiment of the disclosure for achieving the aforementioned purpose may include a display, a motor, a sensor, and a processor configured to receive a signal including information on acceleration of the display apparatus from the sensor while the display is rotated by the motor, identify the size of the acceleration of the display apparatus based on the information on the acceleration, and based on identifying that the display collided with an object based on the size of the acceleration of the display apparatus, control the motor to stop the rotation of the display.

Here, the processor may, based on identifying that the size of the acceleration of the display apparatus is greater than or equal to a threshold value, identify that the display collided with an object.

Also, the processor may receive a signal including information on a plurality of accelerations of different axes from the sensor, and identify the size of the acceleration of the display apparatus based on the sizes of each of the plurality of accelerations.

In addition, the processor may generate a signal corresponding to the size of the acceleration of the display apparatus based on the information on the acceleration received from the sensor, filter the signal through a low pass filter, and based on identifying that the output value of the filtered signal is greater than or equal to a threshold value, identify that the display collided with an object.

Here, the low pass filter may block a signal having a bigger frequency than a cutoff frequency, and the cutoff frequency may be set as the frequency of a signal output as impact irrelevant to the rotation of the display is applied to the display apparatus in a signal corresponding to the size of the acceleration of the display apparatus generated based on a signal received from the sensor while the display does not rotate.

Also, the signal corresponding to the size of the acceleration of the display apparatus generated while the display does not rotate may be filtered by the low pass filter, and the threshold value may be set as a value bigger than the maximum output value of the filtered signal.

In addition, the processor may receive a signal from the sensor at a predetermined time interval while the display rotates, generate a differential signal based on the change of the output value of the signal received at the predetermined time interval, and identify the size of the acceleration of the display apparatus based on the differential signal.

Further, the sensor may be included in a body part of the display apparatus, and generate the signal based on a movement of the body part generated by rotation of the display or collision between the display and the object.

Also, the processor may, based on identifying that the display collided with an object, control the motor to stop the rotation of the display, and rotate the display to the original state, or display a UI for restoring the display to the original state and a UI for keeping rotating the display on the display.

In addition, the processor may receive a signal including information on the angular velocity of the display apparatus from the sensor while the display is rotated by the motor, identify the size of the angular velocity of the display apparatus based on the information on the angular velocity, and based on identifying that the display collided with an object based on the size of the angular velocity of the display apparatus, control the motor to stop the rotation of the display.

Meanwhile, a control method of a display apparatus according to an embodiment of the disclosure for achieving the aforementioned purpose may include the steps of receiving a signal including information on acceleration of the display apparatus from the sensor while the display of the display apparatus is rotated by the motor, identifying the size of the acceleration of the display apparatus based on the information on the acceleration, and based on identifying that the display collided with the object based on the size of the acceleration of the display apparatus, controlling the motor to stop the rotation of the display.

Also, the control method may further include the step of, based on identifying that the size of the acceleration of the display apparatus is greater than or equal to a threshold value, identifying that the display collided with an object.

In addition, the step of receiving may include the step of receiving a signal including information on a plurality of accelerations of different axes from the sensor, and in the step of identifying, the size of the acceleration of the display apparatus may be identified based on the sizes of each of the plurality of accelerations.

Further, the control method may further include the steps of generating a signal corresponding to the size of the acceleration of the display apparatus based on the information on the acceleration received from the sensor, filtering the signal through a low pass filter, and based on identifying that the output value of the filtered signal is greater than or equal to a threshold value, identifying that the display collided with an object.

Here, the low pass filter may block a signal having a bigger frequency than a cutoff frequency, and the cutoff frequency may be set as the frequency of a signal output as impact irrelevant to the rotation of the display is applied to the display apparatus in a signal corresponding to the size of the acceleration of the display apparatus generated based on a signal received from the sensor while the display does not rotate.

Also, the signal corresponding to the size of the acceleration of the display apparatus generated while the display does not rotate may be filtered by the low pass filter, and the threshold value may be set as a value bigger than the maximum output value of the filtered signal.

In addition, in the step of determining, a signal may be received from the sensor at a predetermined time interval while the display rotates, a differential signal may be generated based on the change of the output value of the signal received at the predetermined time interval, and the size of the acceleration of the display apparatus may be identified based on the differential signal.

Further, the sensor may be included in a body part of the display apparatus, and the signal may be generated based on a movement of the body part generated by rotation of the display or collision between the display and the object.

Also, the control method may further include the steps of, based on identifying that the display collided with an object, controlling the motor to stop the rotation of the display, and rotate the display to the original state, or displaying a UI for restoring the display to the original state and a UI for keeping rotating the display on the display.

In addition, the control method may further include the steps of receiving a signal including information on the angular velocity of the display apparatus from the sensor while the display is rotated by the motor, identifying the size of the angular velocity of the display apparatus based on the information on the angular velocity, and based on identifying that the display collided with an object based on the size of the angular velocity of the display apparatus, controlling the motor to stop the rotation of the display.

According to the various embodiments of the disclosure described above, a dis play apparatus may stop rotating in case it collides with an object. Accordingly, injury of a user who collided with a display can be prevented, and also, breakage of the display and the object can be prevented.

DETAILED DESCRIPTION

First, as terms used in this specification and the claims, general terms were selected in consideration of the functions in the disclosure. However, the terms may vary depending on the intention of those skilled in the art who work in the pertinent field, legal or technical interpretation, or emergence of new technologies, etc. Also, there are some terms that were designated by the applicant on his own, and in such cases, the meaning of the terms will be interpreted as defined in this specification. In case there is no specific definition of the terms, the meaning of the terms will be interpreted based on the overall content of this specification and common technical knowledge in the pertinent technical field.

Also, in case it is determined that in describing the disclosure, detailed explanation of related known functions or configurations may unnecessarily confuse the gist of the disclosure, the detailed explanation will be abridged or omitted.

Further, while the embodiments of the disclosure will be described in detail with reference to the following accompanying drawings and the content described in the accompanying drawings, it is not intended that the disclosure is restricted or limited by the embodiments.

The disclosure was devised according to the aforementioned need, and the purpose of the disclosure is in providing a display apparatus which stops rotation of a display in case the display collided with an object, and a control method thereof.

Hereinafter, the disclosure will be described in detail with reference to the accompanying drawings.

Figure 1A:
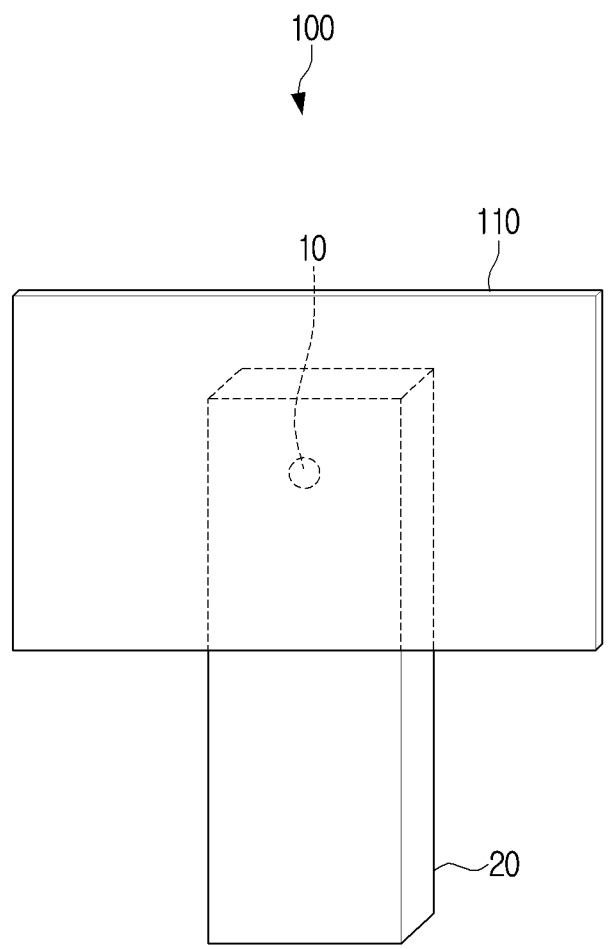
FIG. 1A is a diagram illustrating a display apparatus in a landscape posture (or, a posture in a horizontal direction) according to an embodiment of the disclosure.
Figure 1B:
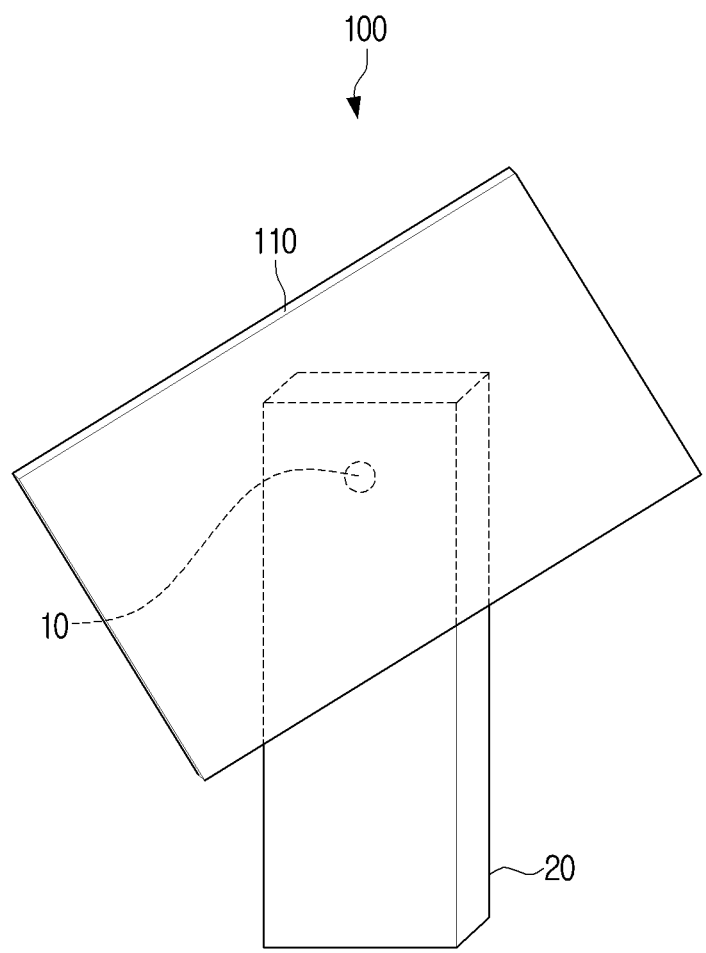
FIG. 1B is a diagram illustrating rotation of a display apparatus according to an embodiment of the disclosure.
Figure 1C:
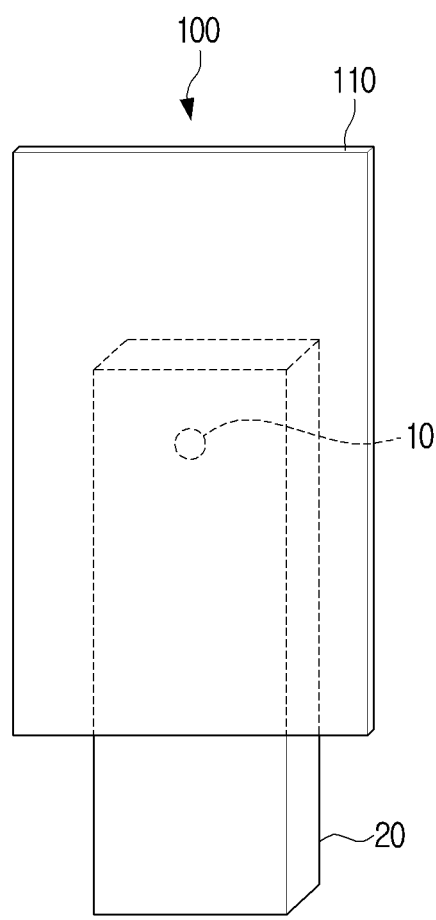
FIG. 1C is a diagram illustrating a display apparatus in a portrait posture (or, a posture in a vertical direction) according to an embodiment of the disclosure.

FIG. 1A to FIG. 1C are diagrams for illustrating operations of a display apparatus according to an embodiment of the disclosure. The display apparatus 100 according to an embodiment of the disclosure may be implemented as various display apparatuses such as a TV, a smart TV, a monitor, an electronic photo frame, an electronic board, an electronic table, a laptop computer, a large format display (LFD), etc.

If an event for rotating the display 110 occurs, the display apparatus 100 may rotate the display 110. Here, examples of an event for rotating the display 110 may be a case wherein a user instruction for rotating the display 110 is input or a case wherein the resolution of an image to be displayed is changed, etc., but an event is not necessarily limited thereto.

Referring to FIG. 1A to FIG. 1C, the display apparatus 100 may include the display 110 and a body part 20 coupled with the display 110. Also, the display 110 may rotate based on a rotation center 10.

According to an embodiment of the disclosure, the display 110 may rotate in a landscape posture (or a posture in a horizontal direction) or a portrait posture (or a posture in a vertical direction).

Here, a landscape posture may be a posture wherein the horizontal length of the display 110 is arranged in a longer form than the vertical length, and a portrait posture may be a posture wherein the vertical length of the display 110 is arranged in a longer form than the horizontal length.

For example, if a user instruction for rotating the display 110 is input while the display 110 is in a landscape posture as in FIG. 1A, the display apparatus 100 may rotate the display 110 in a counter-clockwise direction.

In this case, the display 110 may go through a posture as in FIG. 1B and be in a portrait posture illustrated in FIG. 1C.

Alternatively, if a user instruction for rotating the display 110 is input while the display 110 is in a portrait posture as in FIG. 1C, the display apparatus 100 may rotate the display 110 in a clockwise direction.

In this case, the display 110 may go through a posture as in FIG. 1B and be in a landscape posture illustrated in FIG. 1A.

Meanwhile, embodiments wherein the display 110 rotates are not limited to the embodiments illustrated in FIG. 1A to FIG. 1C. For example, the display 110 may rotate in a clockwise direction in a landscape posture and be in a portrait posture, or rotate in a counter-clockwise direction in a portrait posture and be in a landscape posture.

Also, in the above, a case wherein the display 110 rotates by 90 degrees in a clockwise direction or a counter-clockwise direction and be in a portrait posture or a landscape posture was suggested as an example, but embodiments are not limited thereto. For example, the display 110 may rotate by 90 degrees in a counter-clockwise direction or a clockwise direction in a portrait posture and be in a landscape posture, and may further rotate by 90 degrees in the same direction in the landscape posture and be in a portrait posture.

Meanwhile, in case an object exists within the rotating radius of the display 110 when the display 110 rotates, the display 110 may collide with the object. Here, the object may be a person or a thing.

In case the display 110 collided with an object as above, it is necessary to stop the rotation of the display 110. This is because, if the display 110 keeps rotating after collision, there is a risk that a user who collided with the display 110 may be injured, and there is also a risk that the display 110 or an object that collided with the display 110 may be broken.

For removing such risks, the display apparatus 100 according to an embodiment of the disclosure may stop the rotation of the display 110 if it is identified that the display 110 collided with an object. Hereinafter, explanation will be made with reference to FIG. 2.

Figure 2:
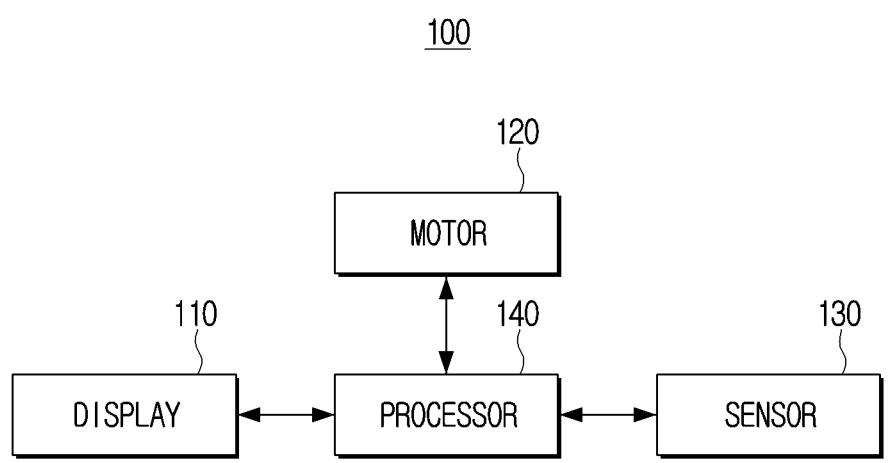
FIG. 2 is a block diagram for illustrating a display apparatus according to an embodiment of the disclosure.

FIG. 2 is a block diagram for illustrating a display apparatus according to an embodiment of the disclosure.

Referring to FIG. 2, the display apparatus 100 according to an embodiment of the disclosure includes a display 110, a motor 120, a sensor 130, and a processor 140.

The display 110 may display various images. Here, an image is a concept including at least one of a still image or a moving image, and the display 110 may display various images such as broadcast contents, multimedia contents, etc. Also, the display 110 may display various kinds of user interfaces (UIs) and icons.

The display 110 may rotate according to driving of the motor 120. Specifically, the display 110 may rotate based on the rotation center 10 while the front surface maintains a specific direction. Here, the rotation center 10 may be a geometrical center location of the display 110, but is not necessarily limited thereto, and it may be another location of the display 110.

According to an embodiment of the disclosure, the display 110 may rotate between a first posture and a second posture perpendicular to the first posture. As an example, the display 110 may rotate in a first direction in the first posture and be in the second posture, and rotate in a second direction in the second posture and be in the first posture.

Here, the first posture may be one of a portrait posture and a landscape posture, and the second posture may be the other one. That is, the first posture may be a posture perpendicular to the second posture. Also, the first direction may be one of a clockwise direction and a counter-clockwise direction, and the second direction may be the other one.

Hereinafter, for the convenience of explanation, explanation will be made based on the assumption that the first posture is a portrait posture, the second posture is a landscape posture, the first direction is a clockwise direction, and the second direction is a counter-clockwise direction.

The display 110 as described above may be implemented as various forms of displays such as a Liquid Crystal Display Panel (LCD), light emitting diodes (LEDs), organic light emitting diodes (OLEDs), Liquid Crystal on Silicon (LCoS), Digital Light Processing (DLP), etc. Also, inside the display 110, a driving circuit that may be implemented in forms such as an a-si TFT, a low temperature poly silicon (LTPS) TFT, an organic TFT (OTFT) and the like, a backlight unit, etc. may be included together.

Also, the display 110 may be coupled with a touch detector and implemented as a touch screen.

Figure 3:
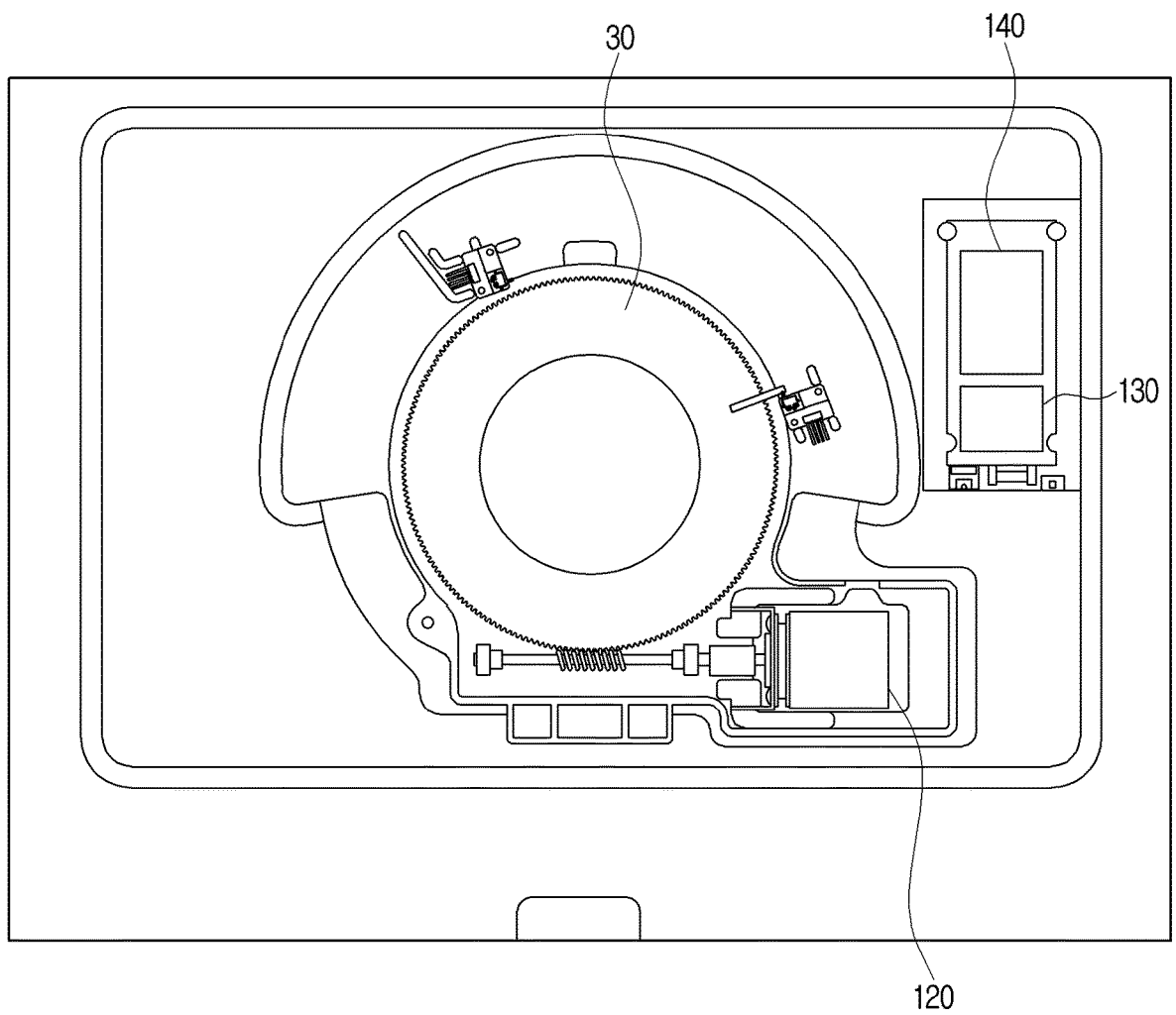
FIG. 3 is a diagram illustrating an internal configuration of a display apparatus 100 according to an embodiment of the disclosure.

The motor 120 may rotate the display 110. Hereinafter, explanation will be made with reference to FIG. 3. The diagram illustrated in FIG. 3 is the internal configuration of the display apparatus 100 according to an embodiment of the disclosure. Meanwhile, this is an example, and the arrangement locations, arrangement forms, and connection structures of the motor 120, the sensor 130, and the processor 140 may be different from FIG. 3 depending on embodiments.

The motor 120 may rotate the display 110 according to control of the processor 140. Specifically, referring to FIG. 3, the motor 120 may be arranged in a location wherein it can rotate the gear 30 (e.g., a round gear) coupled with the display 110, and rotate the display 110 by rotating the gear 30 according to control of the processor 140. Also, the motor 120 may stop the rotation of the gear 30 according to control of the processor 140, and thereby stop the rotation of the display 110. Here, the motor 120 and the gear 30 may be included in the body part 20 of the display apparatus 100, and the gear 30 may be coupled with the display 110 at the rotation center 10.

Meanwhile, the motor 120 may be implemented as various motors that can generate a rotating force. As an example, the motor 120 may be a step motor, an AC motor, a DC motor, etc.

The sensor 130 may detect acceleration of the display apparatus 100. For this, the sensor 130 may be implemented as an acceleration sensor that can detect the change of the speed of the display apparatus 100 at a predetermined time interval, i.e., per unit time.

As an example, the sensor 130 may be a three-axis acceleration sensor that detects acceleration of the display apparatus 100 on an x axis, a y axis, and a z axis. In this case, the sensor 130 may detect acceleration of the display apparatus 100 on the x axis, the y axis, and the z axis, and transmit signals corresponding to the acceleration of each axis to the processor 140. Meanwhile, the aforementioned three-axis acceleration sensor is an example, and it can be deemed that the sensor 130 may be implemented as various sensors that can measure acceleration of the display apparatus 100.

The sensor 130 as described above may be included in the body part 20 of the display apparatus 100, and detect acceleration of the display apparatus 100 on the x axis, the y axis, and the z axis based on a movement of the body part 20 generated by rotation of the display 110 or collision between the display 110 and an object.

Alternatively, the sensor 130 may be included in the display 110. In this case, the sensor 130 may detect acceleration of the display apparatus 100 on the x axis, the y axis, and the z axis based on a movement of the display 110.

The processor 140 controls the overall operations of the display apparatus 100. For this, the processor 140 may include at least one of a central processing unit (CPU), an application processor (AP), or a communication processor (CP).

The processor 140 may operate an operating system or an application program and thereby control hardware or software components connected to the processor 140, and perform various kinds of data processing and operations. Also, the processor 140 may load instructions or data received from at least one of different components on a volatile memory and process them, and store various data in a non-volatile memory.

Meanwhile, the processor 140 according to the disclosure is a concept including at least one processor, and as an example, the processor 140 may be at least one of a processor connected with the display 110 and controls the display 110, a processor connected with the motor 120 and controls the motor 120, or a processor connected with the sensor 130 and controls the sensor 130.

If an event for rotating the display 110 occurs, the processor 140 may control the motor 120 to rotate the display.

Here, a rotation event may be an event wherein a user instruction for rotating the display 110 is input, an event wherein a predetermined time comes, an event wherein the resolution of an image to be displayed and the posture of the display 110 do not correspond, etc. However, this is merely an example, and the rotation event according to the disclosure is not limited thereto.

Specifically, if a user instruction for rotating the display 110 is input, the processor 140 may rotate the display 110. Here, a user instruction may be an instruction selecting a specific button provided on the display apparatus 100 or a remote control, an instruction selecting a menu displayed on the display 110, or an instruction selecting a menu displayed on a user terminal such as a smartphone, etc. Alternatively, a user instruction may be a user voice input into a microphone provided on the display apparatus 100 or a remote control.

If a user instruction is input as described above, the processor 140 may control the motor 120 to rotate the display 110.

Also, in case the time when the posture of the display 110 will be changed is set in advance in the display apparatus 100, if the preset time comes, the processor 140 may control the motor 120 to rotate the display 110.

In addition, in case the resolution of an image to be displayed and the resolution corresponding to the current posture of the display 110 do not correspond, the processor 140 may rotate the display 110.

Specifically, the processor 140 may determine that an image of a resolution wherein the horizontal length is longer than the vertical length corresponds to a landscape posture, and an image of a resolution wherein the vertical length is longer than the horizontal length corresponds to a portrait posture.

Then, if an instruction for displaying an image wherein the horizontal length is longer than the vertical length is input while the display 110 is in a portrait posture, the processor 140 may determine that the image does not correspond to the posture of the display 110, and rotate the display 110 to a landscape posture. In contrast, if an instruction for displaying an image wherein the vertical length is longer than the horizontal length is input while the display 110 is in a landscape posture, the processor 140 may determine that the image does not correspond to the posture of the display 110, and rotate the display 110 to a portrait posture.

Meanwhile, if an event for rotating the display 110 occurs, the processor 140 may output a driving signal for rotating the display 110 to the motor 120.

Specifically, if an event for rotating the display 110 in the first posture to the second posture occurs, the processor 140 may output a driving signal for rotating the display 110 in the first direction to the motor 120.

Here, the driving signal may be a pulse signal. Specifically, if an event for rotating the display 110 in the first posture to the second posture occurs, the processor 140 may sequentially output pulse signals for rotating the display 110 in the first direction to the motor 120. For example, in case the display 110 rotates as much as ¼ (i.e., by 90 degrees) if the motor 120 rotates 40 times, and the motor 120 rotates by 1.8 degrees per 1 pulse, the processor 140 may sequentially output pulse signals to the motor 120 until 8000 pulses are counted, for rotating the display 110 by 90 degrees.

While the display 110 rotates, the processor 140 may identify whether the display 110 collided with an object based on a signal received from the sensor 130.

As described above, the sensor 130 may detect acceleration of the display apparatus 100 on the x axis, the y axis, and the z axis, and transmit signals corresponding to the acceleration of each axis to the processor 140.

Figure 4A:
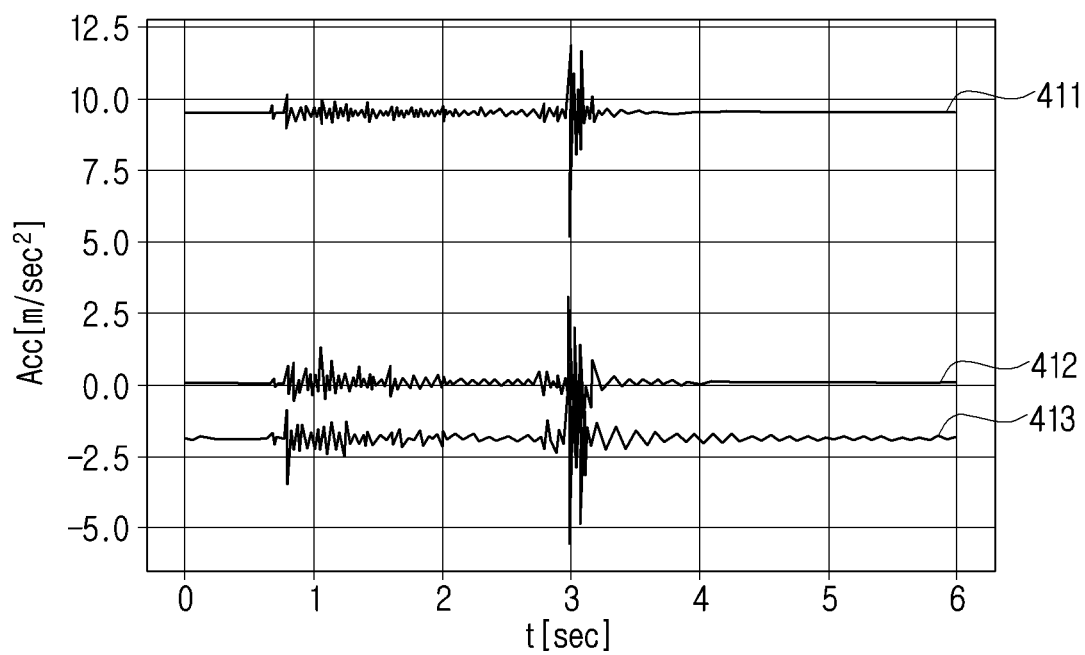
FIG. 4A is a diagram illustrating a signal indicating acceleration of a display apparatus detected by a sensor according to an embodiment of the disclosure.

As an example, referring to FIG. 4A, the sensor 130 may transmit an x(t) signal 411 including information on the acceleration of the display apparatus 100 detected based on the x axis, a y(t) signal 412 including information on the acceleration of the display apparatus 100 detected based on the y axis, and a z (t) signal 413 including information on the acceleration of the display apparatus 100 detected based on the z axis to the processor 140.

In this case, the processor 140 may identify the size of the acceleration of the display apparatus 100 based on the signals 411, 412, 413 corresponding to the acceleration of each axis received from the sensor 130.

Specifically, the processor 140 may identify a Norm value calculated based on the sizes of the signals 411, 412, 413 corresponding to each axis as the size of the acceleration of the display apparatus 100. Here, a Norm value may be acquired by an operation of a mathematical formula such as root $(x(t)^2+y(t)^2+z(t)^2)$. As an example, Norm (1 msec) which is the Norm value at the time 1 [msec] may be acquired by an operation root $(x(1\ msec)^2+y(1\ msec)^2+z(1\ msec)^2)$, and Norm (Nmsec) which is the Norm value at the time N[msec] may be acquired by an operation root $(x(Nmsec)^2+y(Nmsec)^2+z(Nmsec)^2)$.

Figure 4B:
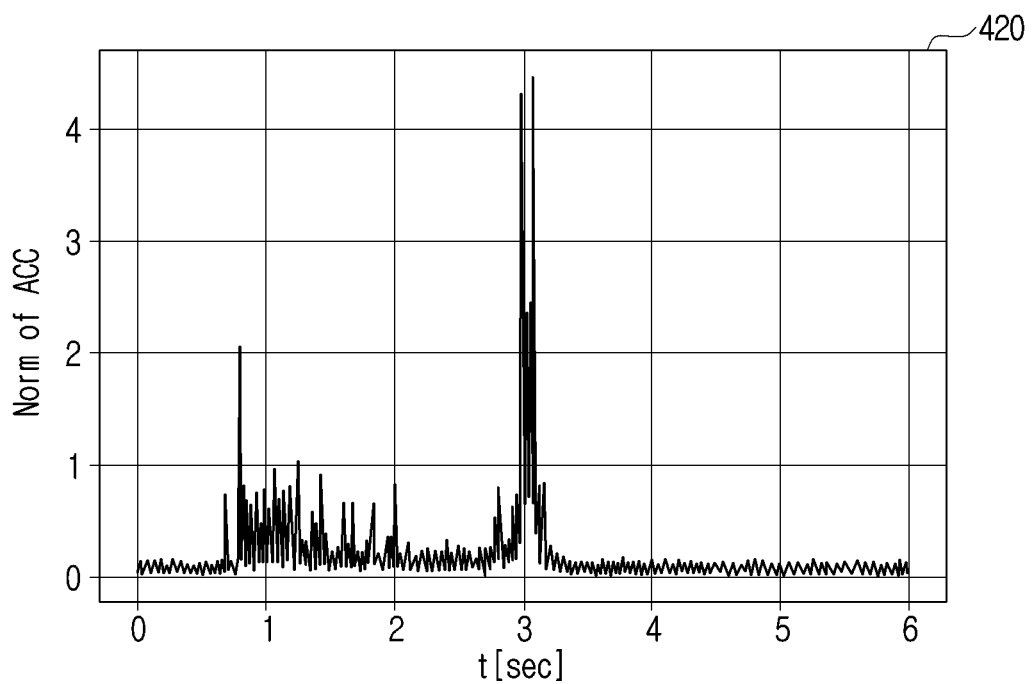
FIG. 4B is a diagram illustrating a signal indicating the size of acceleration of a display apparatus according to an embodiment of the disclosure.

Accordingly, in case a signal as in FIG. 4A is received from the sensor 130, the processor 140 may generate a signal 420 corresponding to the size of the acceleration of the display apparatus 100 as in FIG. 4B through the aforementioned operation.

Then, the processor 140 may identify whether the display 110 collided with an object based on the size of the acceleration of the display apparatus 100.

Figure 4C:
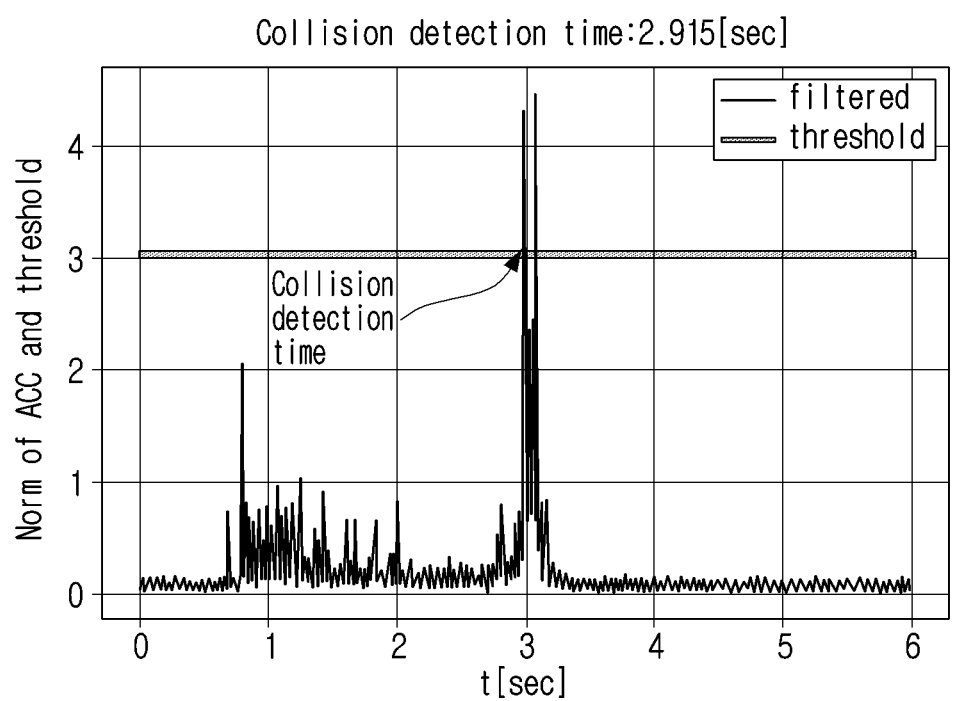
FIG. 4C is a diagram for illustrating an embodiment of identifying the time point of collision based on a threshold value according to an embodiment of the disclosure.

Specifically, if it is identified that the size of the acceleration of the display apparatus 100 is greater than or equal to a threshold value, the processor 140 may identify that the display 110 collided with an object. As an example, in case the threshold value is set as 3.2 [m/sec^2], referring to FIG. 4C, the processor 140 may identify that the display 110 collided with an object at 2.915 [sec] which is the time point when the size of the acceleration of the display apparatus 100 is 3.2 [m/sec^2]. Explanation related to setting of a threshold value will be described below with reference to FIG. 6.

Meanwhile, in the above, an embodiment of identifying the size of the acceleration of the display apparatus 100 based on the sizes of signals received from the sensor 130 was described.

However, depending on embodiments, the processor 140 may identify the size of the acceleration of the display apparatus 100 based on differential signals generated based on signals received from the sensor 130.

Figure 5A:
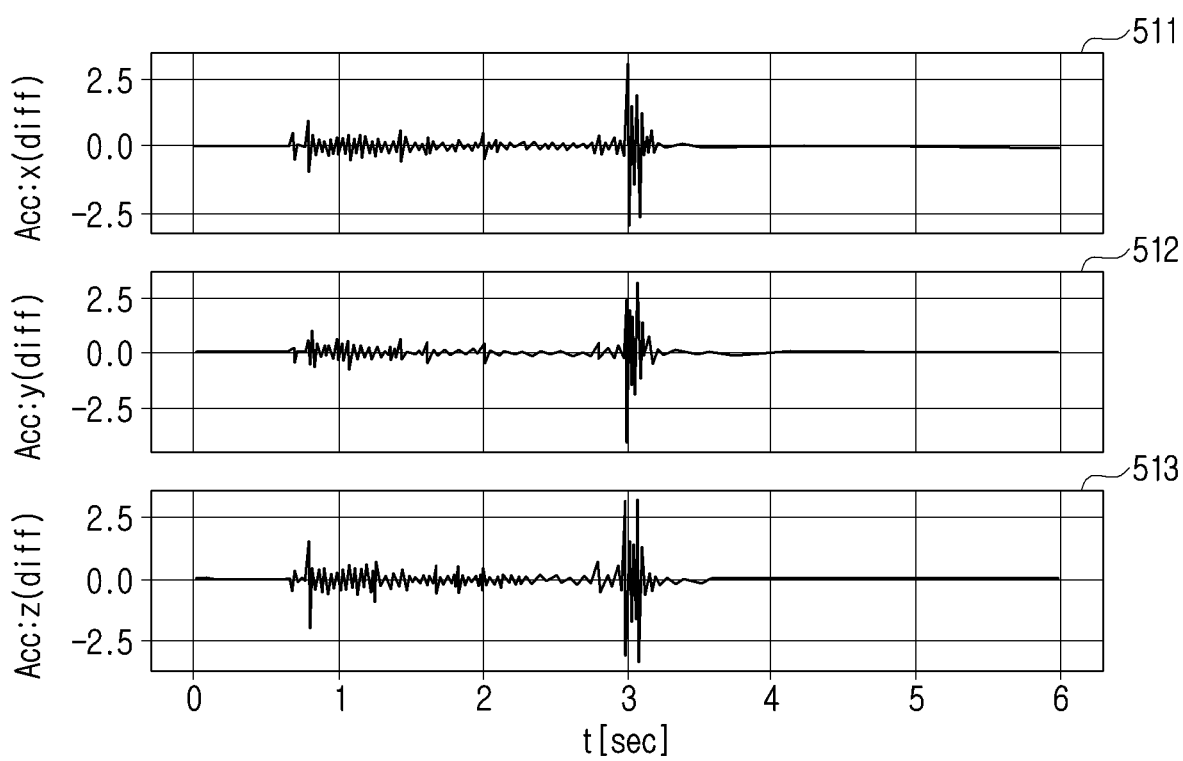
FIG. 5A is a diagram illustrating a differential signal according to an embodiment of the disclosure.

Specifically, if signals 411, 412, 413 corresponding to the acceleration of each signal as in FIG. 4A are received from the sensor 130, the processor 140 may generate differential signals 511, 512, 513 corresponding to the acceleration of each axis as in FIG. 5A. Here, the differential signals may be signals wherein offsets have been removed from the signals received from the sensor 130.

Specifically, the sensor 130 may detect the acceleration of the display apparatus 100 at a predetermined time interval, i.e., per unit time, and transmit the aforementioned signals 411, 412, 413 corresponding to the acceleration of each axis to the processor 140. In this case, the processor 140 may identify the changes of the output values of the signals 411, 412, 413 corresponding to the acceleration of each axis at a predetermined time interval, i.e., per unit time, and generate differential signals 511, 512, 513 corresponding to the acceleration of each axis based on the changes of the output values. As an example, in case the aforementioned time interval is 1 [msec], the processor 140 may receive signals corresponding to the acceleration of each axis at an interval of 1 [msec] from the sensor 130. Then, if it is determined that the acceleration of the display apparatus 100 at the time t [msec] is 0.2 [m/sec^2], and the acceleration of the display apparatus 100 at the time t−10 [msec] is 0.5 [m/sec^2] based on the signals received from the sensor 130, the processor 140 may generate differential signals having an output value of 0.3 [m/sec^2] at the time t.

That is, in case the aforementioned predetermined time is a, the processor 140 may generate a first differential signal corresponding to the x axis based on an operation x(t)−x(t−a), generate a second differential signal corresponding to the y axis based on an operation y(t)−y (t−a), and generate a third differential signal corresponding to the z axis based on an operation z (t)−z (t−a). In FIG. 5A, the first differential signal 511 may be the differential signal of the signal 411 corresponding to the acceleration on the x axis in FIG. 4A, the second differential signal 512 may be the differential signal of the signal 412 corresponding to the acceleration on the y axis in FIG. 4A, and the third differential signal 513 may be the differential signal of the signal 413 corresponding to the acceleration on the z axis in FIG. 4A.

Meanwhile, the aforementioned method of generating differential signals is an example, and the processor 140 may generate differential signals through various methods. As an example, the processor 140 may calculate an output average value of a section wherein there is no change in the output value (e.g., the 0 to 0.7 [sec] section in FIG. 4A) from a signal received from the sensor 130, and generate differential signals based on the difference between the output value of the signal received from the sensor 130 and the aforementioned output average value.

Figure 5B:
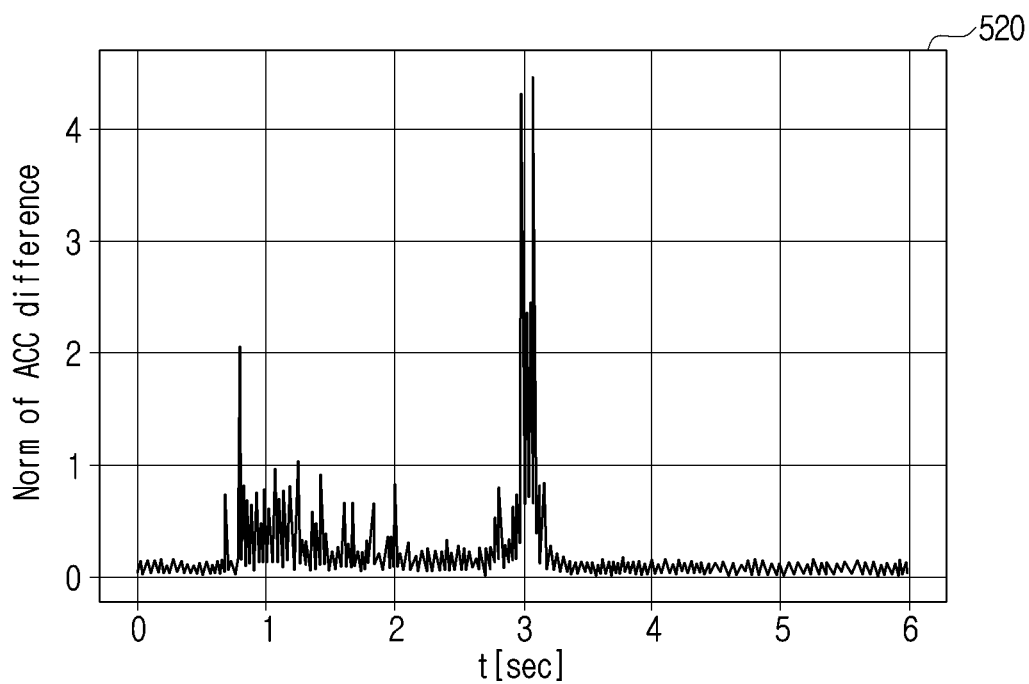
FIG. 5B is a diagram illustrating a signal indicating the size of acceleration of a display apparatus according to an embodiment of the disclosure.

The processor 140 may identify the size of the acceleration of the display apparatus 100 based on differential signals. Specifically, the processor 140 may identify a Norm value calculated based on differential signals 511, 512, 513 corresponding to each axis as the size of the acceleration of the display apparatus 100. Here, the Norm value may be acquired by an operation of a mathematical formula such as root $((x(t)-x(t-a))^2+(y(t)-y(t-a))^2+(z(t)-z(t-a))^2)$. As an example, in case first to third differential signals 511, 512, 513 as in FIG. 5A are generated, the processor 140 may generate a signal 520 corresponding to the size of the acceleration of the display apparatus 100 as in FIG. 5B through the aforementioned operation.

Then, as described above, the processor 140 may identify whether the display 110 collided with an object based on the size of the acceleration of the display apparatus 100 and the threshold value, as described above.

Meanwhile, in the aforementioned signals 420, 520 corresponding to the size of the acceleration of the display apparatus 100, a signal that is output as impact irrelevant to the rotation of the display 110 is applied to the display apparatus 100 may be included.

As an example, in case a user moves or jumps around the display apparatus 100, as the bottom on which the display apparatus 100 is arranged vibrates, impact irrelevant to the rotation of the display 110 may be applied to the display apparatus 100. In this case, even though the display 110 that is rotating did not collide with an object, the sensor 130 may output a signal having a big size of acceleration. Accordingly, in the signals 420, 520 corresponding to the size of the acceleration of the display apparatus 100, a signal that is output as impact irrelevant to the rotation of the display 110 is applied to the display apparatus 100 needs to be filtered.

For this, the display apparatus 100 according to an embodiment of the disclosure may further include a filter. Here, the filter may be a low pass filter that blocks a signal having a bigger frequency than a cutoff frequency.

Then, the processor 140 may filter the signals 420, 520 corresponding to the size of the acceleration of the display apparatus 100 through the filter. Hereinafter, explanation will be made with an example of filtering of the signal 520 corresponding to the size of the acceleration of the display apparatus 100 that was generated based on a differential signal, for the convenience of explanation, but it is obvious that a subject of filtering may be the signal 420 corresponding to the size of the acceleration of the display apparatus 100 that was generated based on a signal received from the sensor 130.

The processor 140 may filter the signal 520 corresponding to the size of the acceleration of the display apparatus 100 through the filter.

Here, a cutoff frequency of the filter may be set as a frequency for blocking a signal that is output as impact irrelevant to the rotation of the display 110 is applied to the display apparatus 100, among the signals corresponding to the size of the acceleration of the display apparatus 100. A cutoff frequency as described above may not only be set in a manufacturing step of a product, but it may also be set by the processor 140.

Figure 6A:
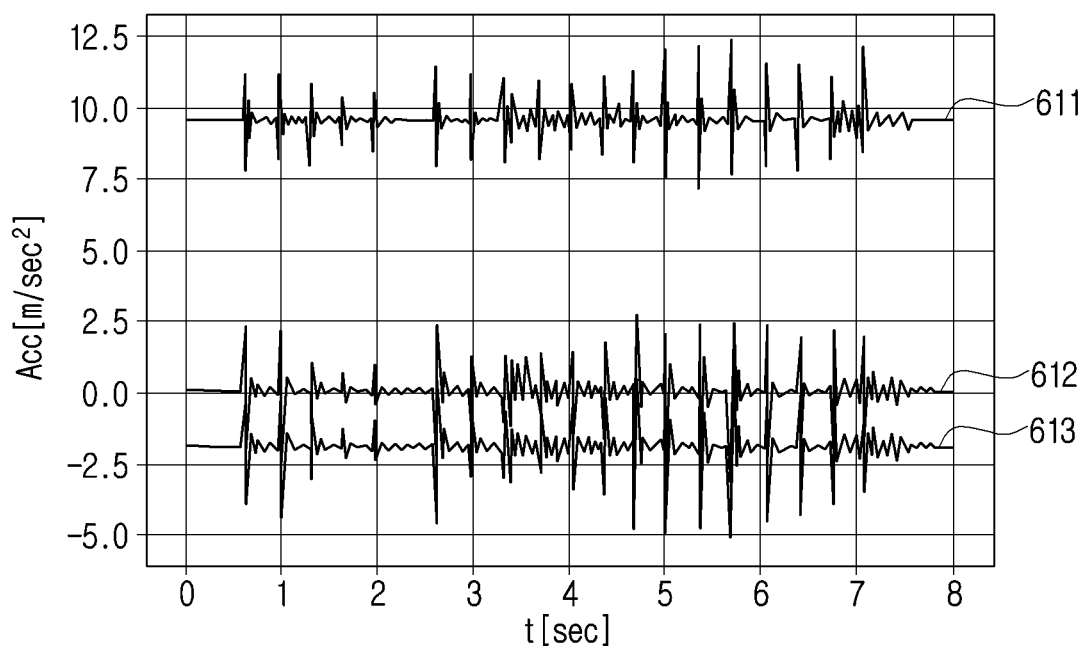
FIG. 6A is a diagram illustrating a signal indicating acceleration of a display apparatus detected by a sensor according to an embodiment of the disclosure.
Figure 6B:
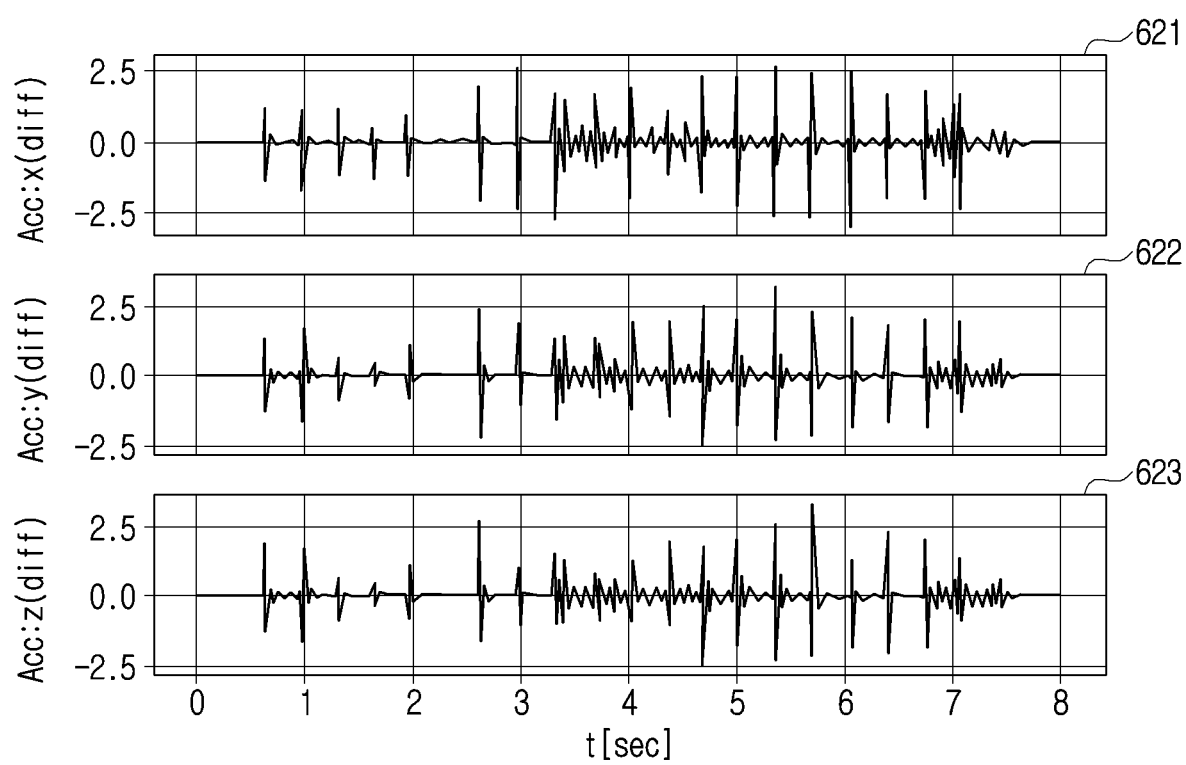
FIG. 6B is a diagram illustrating a differential signal according to an embodiment of the disclosure.

Specifically, in case signals 611, 612, 613 corresponding to the acceleration of each axis as in FIG. 6A are received from the sensor 130 while the display 110 does not rotate, the processor 140 may generate differential signals 621, 622, 623 corresponding to the acceleration of each axis as in FIG. 6B. Then, the processor 140 may generate a signal 630 corresponding to the size of the acceleration of the display apparatus 100 as in FIG. 6C, based on the sizes of the differential signals 621, 622, 623 corresponding to the acceleration of each axis. As detailed explanation in this regard was described above, it will be omitted here.

Then, the processor 140 may set the frequency of a signal having a relatively big frequency in the signal 630 corresponding to the size of the acceleration of the display apparatus 100 as the cutoff frequency of the filter. For this, the processor 140 may perform Fourier transformation on the signal 630 corresponding to the size of the acceleration of the display apparatus, and identify frequency components of the signal 630 corresponding to the size of the acceleration of the display apparatus 100.

Meanwhile, the threshold value may not only be set in a manufacturing step of a product, but it may also be set by the processor 140.

Figure 6C:
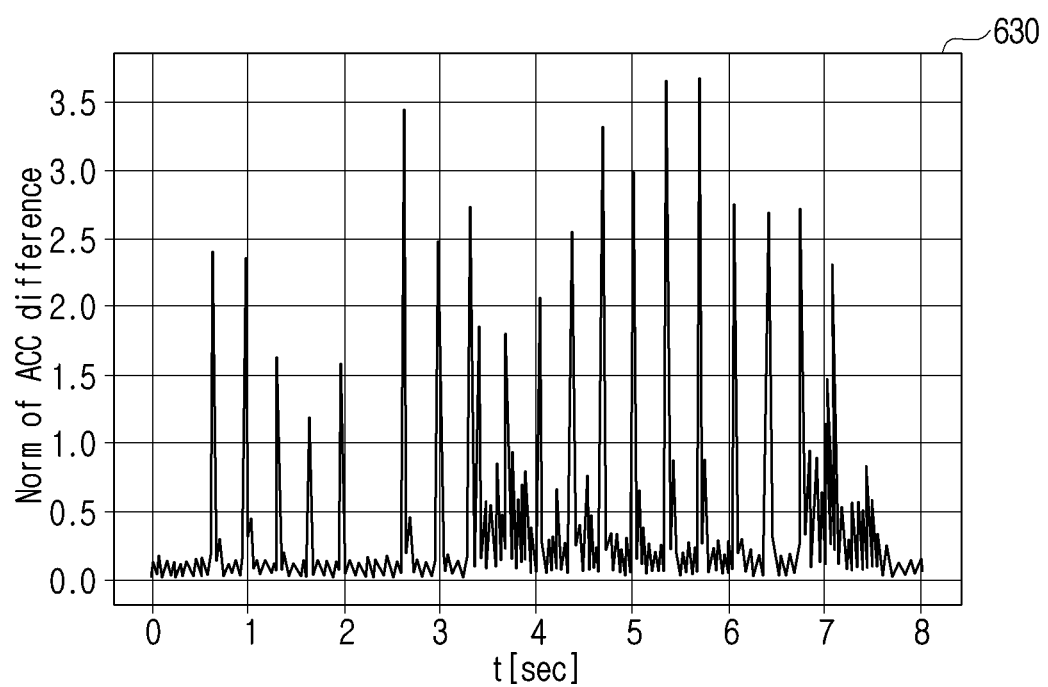
FIG. 6C is a diagram illustrating a signal indicating the size of acceleration of a display apparatus according to an embodiment of the disclosure.
Figure 6D:
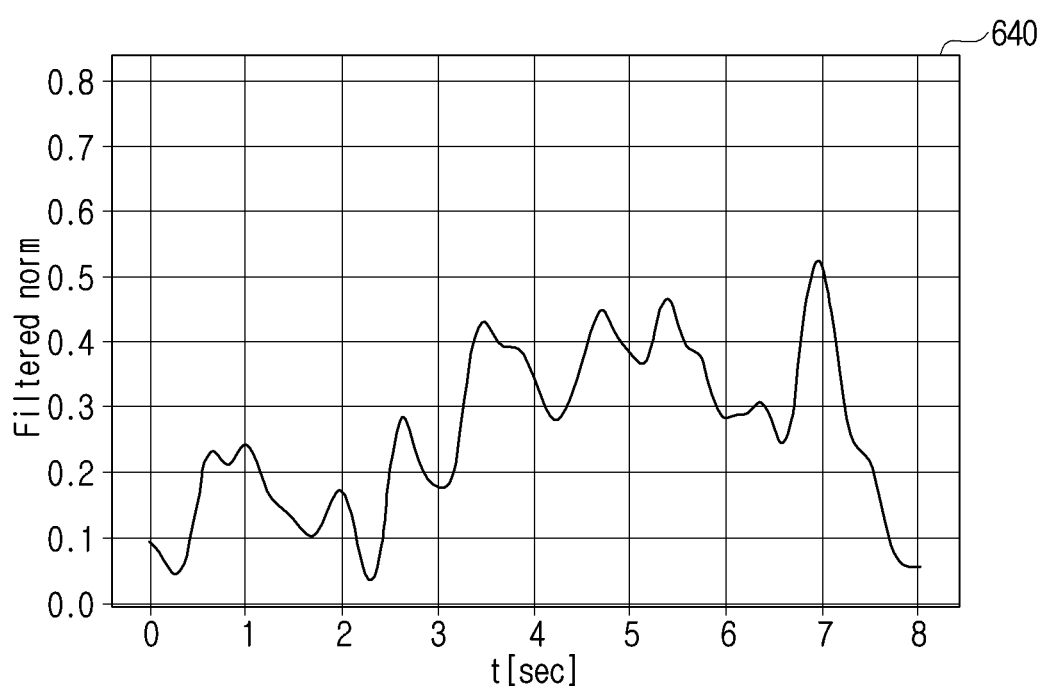
FIG. 6D is a diagram illustrating a filtered signal according to an embodiment of the disclosure.

Specifically, if a signal 630 corresponding to the size of the acceleration of the display apparatus 100 as in FIG. 6C is generated while the display 110 does not rotate, the processor 140 may filter the signal 630 corresponding to the size of the acceleration of the display apparatus 100 through the filter, and thereby acquire a filtered signal 640 as in FIG. 6D.

Figure 6E:
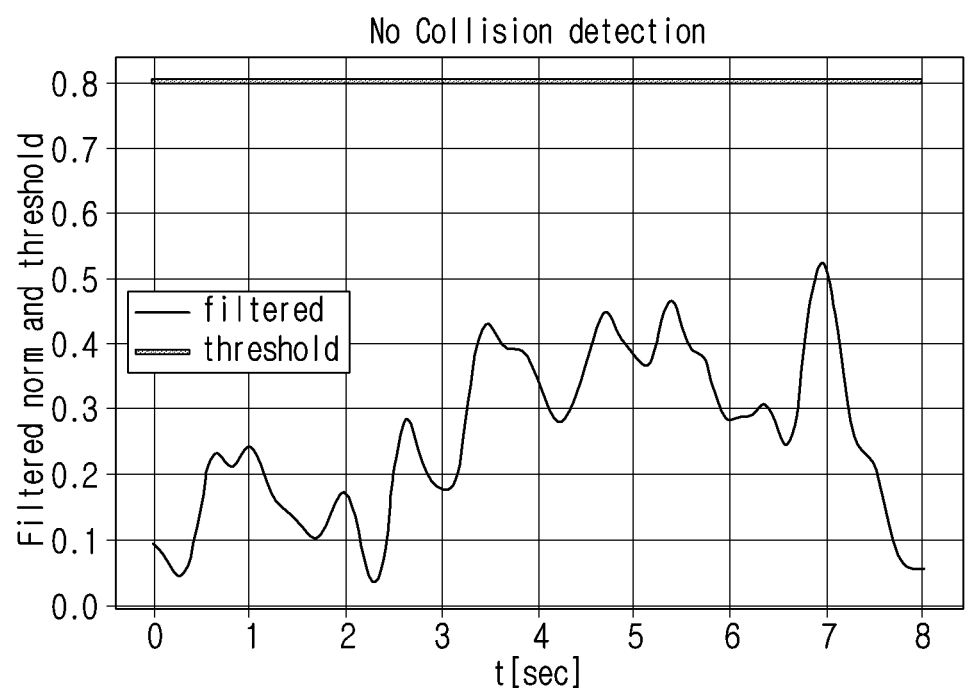
FIG. 6E is a diagram for illustrating an embodiment of identifying the time point of collision based on a filtered signal according to an embodiment of the disclosure.

In this case, the processor 140 may set the threshold value as a value bigger than the maximum output value of the filtered signal 640. As an example, in case a filtered signal 640 as in FIG. 6D is acquired, the processor 140 may set the threshold value as a value bigger than 0.52 [m/sec⁻2] which is the maximum output value. Specifically, if the predetermined value is a value bigger than the maximum output value of the filtered signal 640, for example, if the predetermined value is 0.28 [m/sec⁻2], the processor 140 may set 0.8 [m/sec⁻2] as the threshold value. Accordingly, as illustrated in FIG. 6E, in case impact irrelevant to the rotation of the display 110 is applied to the display apparatus 100, the processor 140 may identify that the display 110 that is rotating did not collide with an object.

Figure 5C:
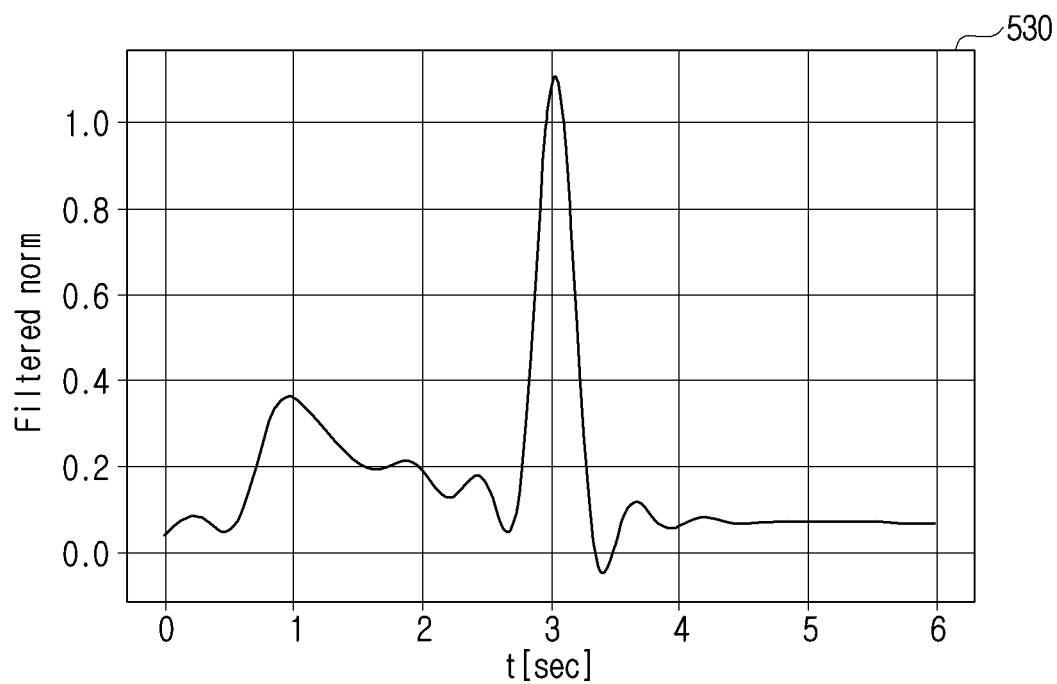
FIG. 5C is a diagram illustrating a filtered signal according to an embodiment of the disclosure.

Referring to FIG. 5B again, the processor 140 may filter the signal 520 corresponding to the size of the acceleration of the display apparatus 100 through the filter, and thereby acquire a filtered signal wherein a signal having a bigger frequency than the cutoff frequency of the filter has been blocked. That is, the processor 140 may acquire a signal wherein output irrelevant to the collision of the display 110 that is rotating has been blocked in the signal 520 corresponding to the size of the acceleration of the display apparatus 100. As an example, the processor 140 may filter the signal 520 corresponding to the size of the acceleration as in FIG. 5B through the filter, and thereby acquire a filtered signal 540 as in FIG. 5C.

Then, the processor 140 may identify whether the display 110 collided with an object based on the output value of the filtered signal 540.

Figure 5D:
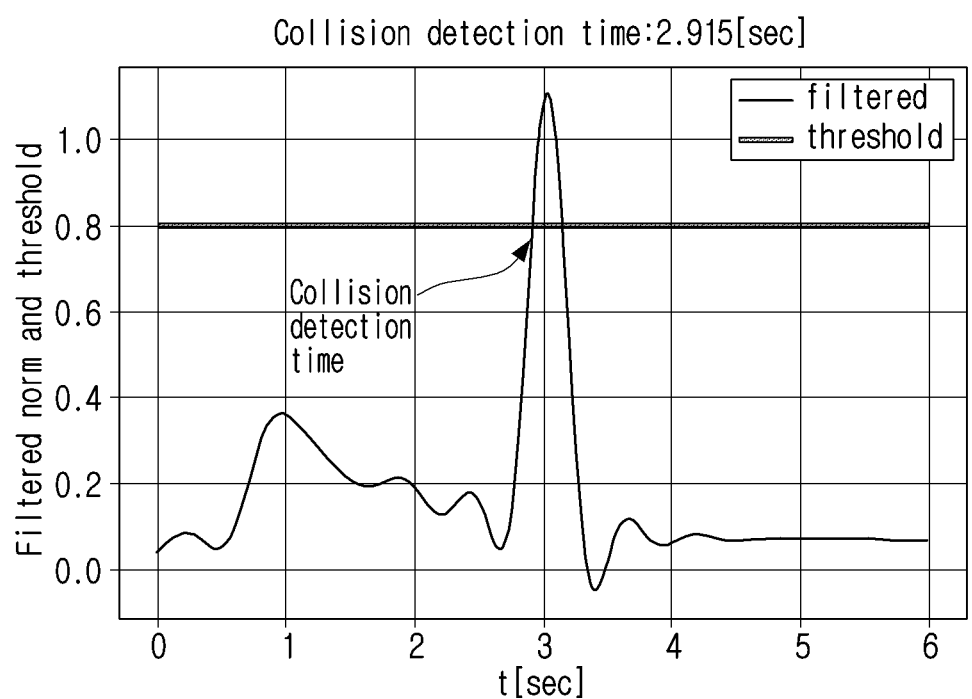
FIG. 5D is a diagram for illustrating an embodiment of identifying the time point of collision based on a filtered signal according to an embodiment of the disclosure.

Specifically, if it is identified that the output value of the filtered signal 540 is greater than or equal to the threshold value, the processor 140 may identify that the display 110 collided with an object. As an example, in case the threshold value is set as 0.8 [m/sec⁻2], referring to FIG. 5D, the processor 140 may identify that the display 110 collided with an object at 2.915 [sec] which is the time point when the size of the acceleration of the display apparatus 100 is 0.8 [m/sec⁻2].

FIGS. 7A to 8C are diagrams for illustrating operations of a display apparatus after collision according to an embodiment of the disclosure.

If it is identified that the display 110 collided with an object, the processor 140 may stop the rotation of the display 110, display a message notifying collision with an object through the display 110, and control the motor 120 to rotate the display 110 in a reverse direction.

Figure 7A:
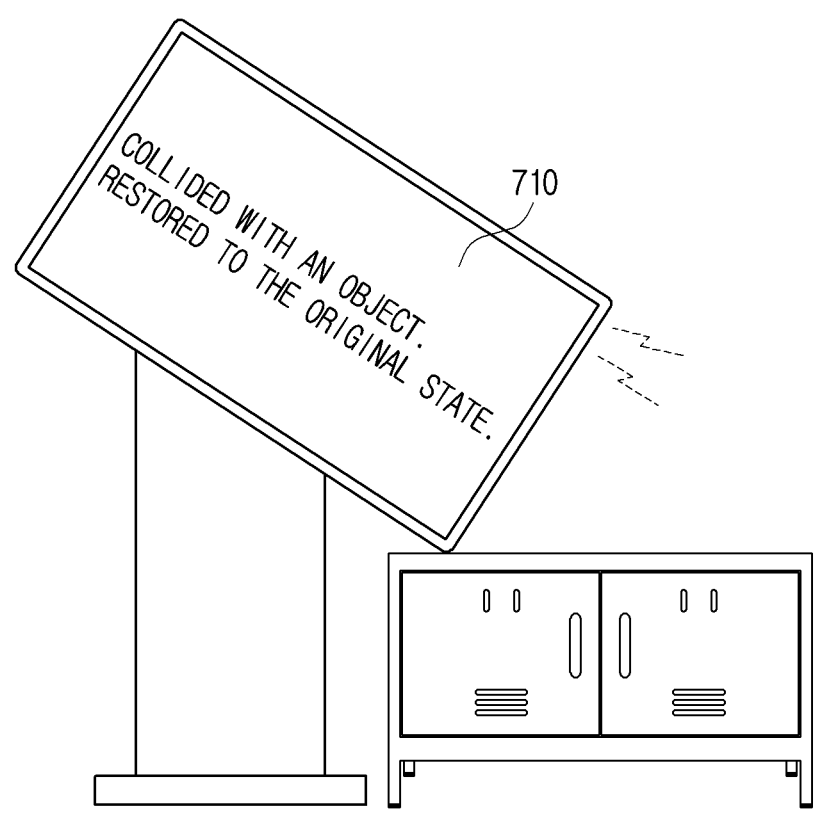
FIG. 7A is a diagram for illustrating an operation of an apparatus after collision of a display according to an embodiment of the disclosure.

For example, referring to FIG. 7A, if it is identified that the display 110 collided with an object, the processor 140 may display a message 710 such as "Collided with an object. Restored to the original state" through the display 110, and control the motor 120) to rotate the display 110 in a reverse direction. Also, if it is identified that the display 110 collided with an object, the processor 140 may output a warning sound through the speaker.

Figure 7B:
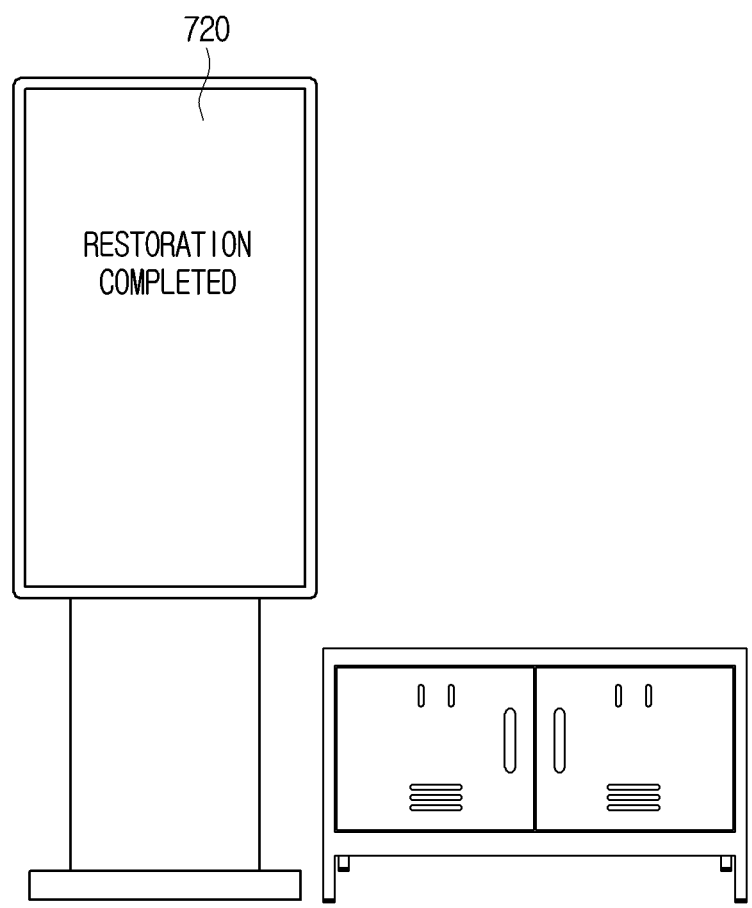
FIG. 7B is a diagram for illustrating an operation after collision of a display according to an embodiment of the disclosure.

Then, the processor 140 may restore the display 110 to the original state, and then display a message 720 such as "Restoration completed" as illustrated in FIG. 7B.

Meanwhile, this is an example, and if it is identified that the display 110 collided with an object, the processor 140 may stop the rotation of the display 110, control the motor 120 to rotate the display 110 in a reverse direction, and when the rotation of the motor 120 is stopped (i.e., when the display 110 is restored to the original state), display a message notifying that collision with an object was detected through the display 110. As an example, if the display 110 collides with an object and is then restored to the original state, the processor 140 may display a message such as "As collision was detected, the display was restored to the original state" through the display 110.

Accordingly, a user may recognize that the display 110 was restored to the original state by collision between the display 110 and an object, and move the display apparatus 100 or a surrounding object to another location.

Meanwhile, here, it is described that, if it is identified that the display 110 collided with an object, the rotation of the display 110 is stopped, and the display 110 is rotated in a reverse direction automatically, but this is merely an example.

Figure 8A:
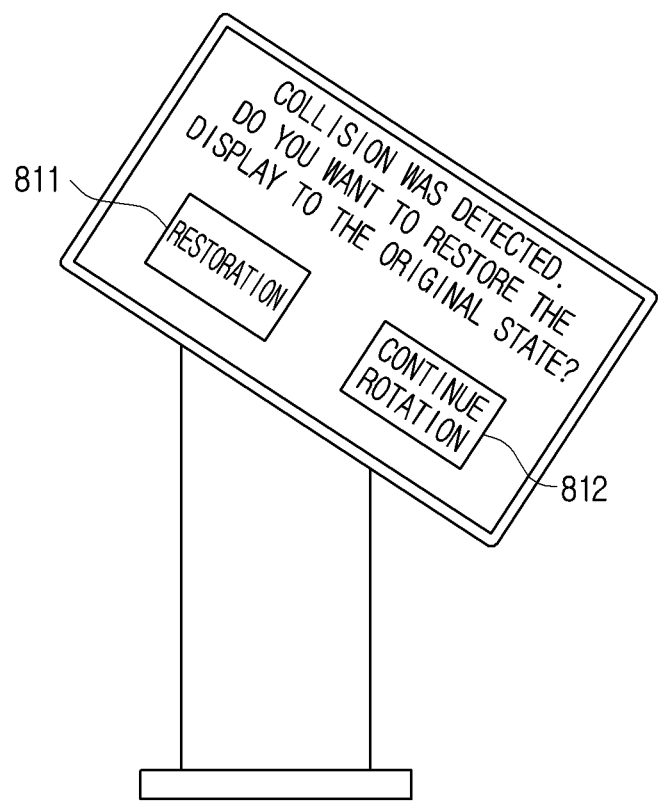
FIG. 8A is a diagram for illustrating an operation after collision of a display according to an embodiment of the disclosure.

For example, referring to FIG. 8A, if it is identified that the display 110 collided with an object, the processor 140 may stop the rotation of the display 110, and display a UI for receiving a user instruction regarding whether to keep rotating the display 110 or to rotate the display 110 in a reverse direction on the display 110. For example, as illustrated in FIG. 8A, the processor 140 may display a message such as "Collision was detected. Do you want to restore the display to the original state?" and a first UI 811 for restoration to the original state and a second UI 812 for continuous rotation.

Here, if a user instruction selecting the first UI 811 for restoration to the original state is received, the processor 140 may rotate the display 110 in a reverse direction and restore it to the original state, and if a user instruction selecting the second UI 812 for continuous rotation is received, the processor 140 may keep rotating the display 110.

Meanwhile, if it is identified that the display 110 collided with an object, the processor 140 may display a UI for receiving a user instruction regarding whether to maintain the current state.

Figure 8B:
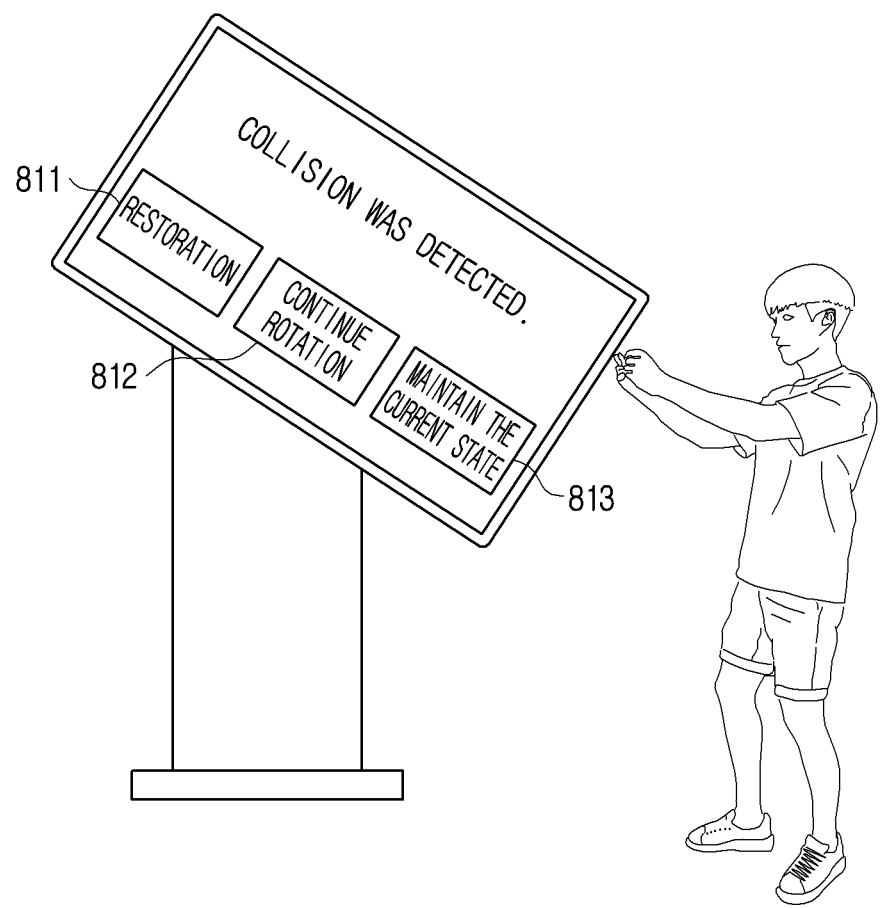
FIG. 8B is a diagram for illustrating an operation after collision of a display according to an embodiment of the disclosure.
Figure 8C:
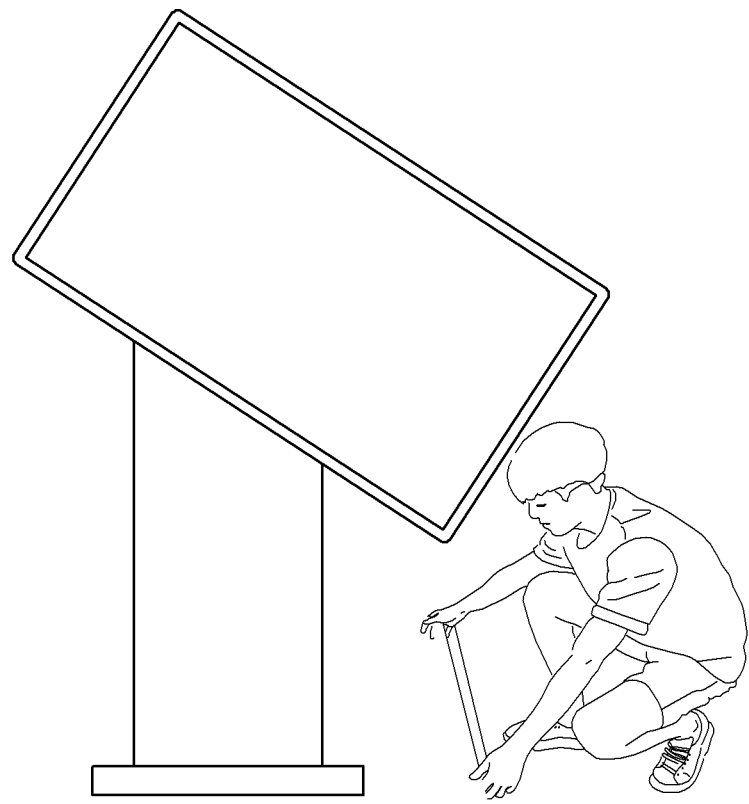
FIG. 8C is a diagram for illustrating an operation after collision of a display according to an embodiment of the disclosure.

For example, referring to FIG. 8B, if it is identified that the display 110 collided with an object, the processor 140 may stop the rotation of the display 110, and display a message such as "Collision was detected," the first UI 811 for restoration to the original state, the second UI 812 for continuous rotation, and the third UI 813 for maintaining the current state.

Here, if a user instruction selecting the third UI 813 for maintaining the current state is received, the processor 140 may display the image that was displayed on the display 110 before the rotation stopped through the display 110. This is in consideration of a circumstance that a user intentionally stopped the rotation of the display 110 as illustrated in FIG. 8B. As an example, in case an image photographed while the camera was tilted is reproduced, a user may intentionally stop the rotation of the display 110 if the display 110 rotates by a specific angle.

Meanwhile, if it is identified that the display 110 collided with an object, the processor 140 may temporarily stop the rotation of the display 110, and rotate the display 110 again after a predetermined time passes. As an example, if collision with an object is detected, the processor 140 may stop the rotation of the display 110 from the first posture to the second posture, and rotate the display 110 again after two seconds.

Afterwards, if it is identified that the display 110 is rotated based on a signal received from the sensor 130, the processor 140 may keep rotating the display 110 in the second posture, and if it is identified that the display 110 is not rotated, the processor 140 may display at least one of the aforementioned first, second, or third UIs on the display 110. This is in consideration of a circumstance that collision between the display 110 and a user temporarily occurs as the user moves to the surroundings of the display 110. For example, in case a user performs a job around the display 110 as in FIG. 8C, the display 110 may collide with the user while rotating. Here, the rotation of the display 110 may be stopped, and the user who felt collision may get out of the surroundings of the display 110. In such a case, in the disclosure, the display 110 may be rotated again without an additional user instruction.

Figure 9:
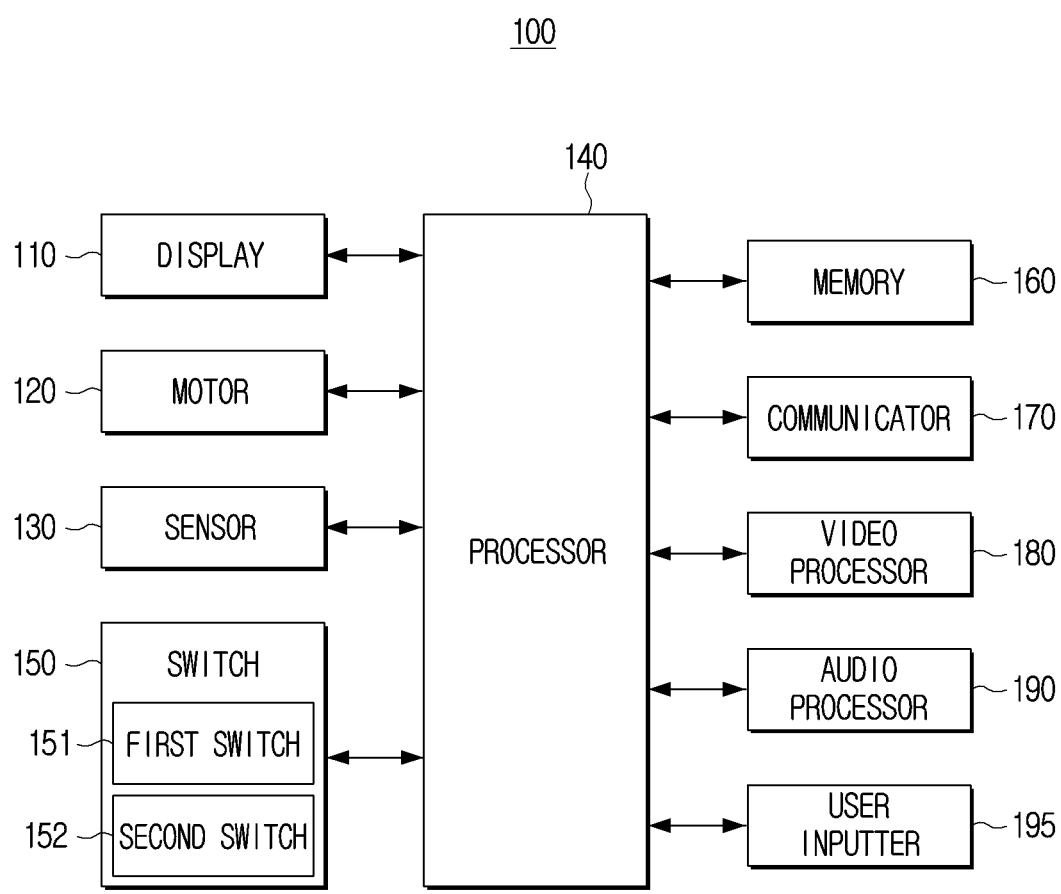
FIG. 9 is a detailed block diagram for illustrating a display apparatus according to an embodiment of the disclosure.

FIG. 9 is a detailed block diagram for illustrating a display apparatus according to an embodiment of the disclosure. Hereinafter, parts overlapping with the aforementioned descriptions will be omitted or described in abridged forms.

Referring to FIG. 9, the display apparatus 100 according to an embodiment of the disclosure may include a display 110, a motor 120, a sensor 130, a switch 150, a memory 160, a communicator 170, a video processor 180, an audio processor 190, a user inputter 195, and a processor 140.

The sensor 130 may be implemented as an acceleration sensor for detecting acceleration of the display apparatus 100 as described above.

However, this is an example, and the sensor 130 may be implemented as a gyro sensor for detecting the angular velocity of the display apparatus 100. Here, the gyro sensor is a component that converts the Coriolis force measured based on the rotation of the display apparatus 100 into an electronic signal and outputs the signal, and as an example, the gyro sensor may be a three-axis gyro sensor that detects the angular velocity of the display apparatus 100 on the x axis, the y axis, and the z axis. In this case, the gyro sensor may detect the angular velocity of the display apparatus 100 on the x axis, the y axis, and the z axis, and transmit signals corresponding to the angular velocity of each axis to the processor 140. Meanwhile, the aforementioned three-axis gyro sensor is an example, and it can be deemed that the sensor 130 may be implemented as various sensors that can measure the angular velocity of the display apparatus 100.

The gyro sensor as described above may be included in the body part 20 of the display apparatus 100, and it may detect the angular velocity of the display apparatus 100 based on a movement of the body part 20 that is generated by rotation of the display 110 or collision between the display 110 and an object.

While the display 110 rotates, the processor 140 may identify whether the display 110 collided with an object based on a signal received from the gyro sensor.

As described above, the gyro sensor may detect the angular velocity of the display apparatus 100 on the x axis, the y axis, and the z axis, and transmit signals corresponding to the angular velocity of each axis to the processor 140. As an example, the gyro sensor may transmit an x(t) signal including information on the angular velocity of the display apparatus 100 detected based on the x axis, a y(t) signal including information on the angular velocity of the display apparatus 100 detected based on the y axis, and a z (t) signal including information on the angular velocity of the display apparatus 100 detected based on the z axis to the processor 140.

In this case, the processor 140 may identify the size of the angular velocity of the display apparatus 100 based on signals corresponding to the angular velocity of each axis received from the gyro sensor. Specifically, the processor 140 may identify the size of the angular velocity of the display apparatus 100 based on an operation of a mathematical formula such as $\sqrt{x(t)^2 + y(t)^2 + z(t)^2}$.

Then, the processor 140 may identify whether the display 110 collided with an object based on the size of the angular velocity of the display apparatus 100. Specifically, if it is identified that the size of the angular velocity of the display apparatus 100 is greater than or equal to a threshold value, the processor 140 may identify that the display 110 collided with an object. As an example, in case the threshold value is set as 3.0 [°/sec], the processor 140 may identify that the display 110 collided with an object at t1 [sec] which is the time point when the size of the angular velocity of the display apparatus 100 is 3.0 [°/sec].

Meanwhile, the gyro sensor may be included in the display 110. In this case, the gyro sensor may detect the angular velocity of the display 110 based on the movement of the display 110.

Then, while the display 110 rotates, the processor 140 may identify whether the display 110 collided with an object based on a signal received from the sensor.

As described above, the gyro sensor may detect the angular velocity of the display apparatus 100 on the x axis, the y axis, and the z axis, and transmit signals corresponding to the angular velocity of each axis to the processor 140. Then, the processor 140 may identify the size of the angular velocity of the display 110 based on the signals corresponding to the angular velocity of each axis received from the gyro sensor. Also, if it is identified that the size of the angular velocity of the display 110 is smaller than or equal to a threshold value while the display 110 rotates, i.e., before the rotation of the display 110 in the first posture to the second posture is completed (or, in an opposite case), the processor 140 may identify that the display 110 collided with an object.

As an example, in case the threshold value is set as 10 [°/sec], if the size of the angular velocity of the display 110 that was rotating in the size of the angular velocity of 18[°/sec] is changed to 10 [°/sec] at the time point t1, the processor 140 may identify that the display 110 collided with an object at the time point t1.

Meanwhile, the processor 140 may generate differential signals based on signals received from the gyro sensor in a similar way to the aforementioned method of identifying whether the display apparatus 100 collided with an object through the acceleration sensor, and identify whether the display apparatus 100 collided with an object based on the differential signals. Also, the processor 140 may filter a signal corresponding to the size of the angular velocity of the display apparatus 100 through the filter, and identify whether the display apparatus 100 collided with an object based on the filtered signal. As the technical idea in this regard is similar to the aforementioned method of identifying whether the display apparatus 100 collided with an object through the acceleration sensor, detailed explanation will be omitted.

Meanwhile, the processor 140 may identify whether the display 110 collided with an object in consideration of both the signals received from the acceleration sensor and the signals received from the angular velocity sensor. As an example, in case the size of the acceleration of the display apparatus 100 identified based on signals received from the acceleration sensor is greater than or equal to a threshold value, or the size of the angular velocity of the display apparatus 100 identified based on signals received from the gyro sensor included in the body part 20 is greater than or equal to a threshold value, the processor 140 may identify that the display 110 collided with an object. Alternatively, in case the size of the acceleration of the display apparatus 100 is greater than or equal to a threshold value, and the size of the angular velocity of the display apparatus 100 is greater than or equal to a threshold value, the processor 140 may identify that the display 110 collided with an object.

Alternatively, in case the gyro sensor is included in the display 110, if the size of the acceleration of the display apparatus 100 identified based on signals received from the acceleration sensor is greater than or equal to a threshold value, or the size of the angular velocity of the display 110 identified based on signals received from the gyro sensor is smaller than or equal to a threshold value, the processor 140 may identify that the display 110 collided with an object. Alternatively, in case the size of the acceleration of the display apparatus 100 is greater than or equal to a threshold value, and the size of the angular velocity of the display apparatus 100 is smaller than or equal to a threshold value, the processor 140 may identify that the display 110 collided with an object.

The switch 150 may include a first switch 151 and a second switch 152. Here, while the display 110 is in the first posture, the bar of the first switch 151 may be pushed as much as a predetermined first angle by a bar included in the round gear 30. In a similar manner, while the display 110 is in the second posture, the bar of the second switch 152 may be pushed as much as a predetermined second angle by a bar included in the round gear 30. Here, the predetermined first and second angles may not only be different, but they may also be identical.

For this, in the display apparatus 100, information on a first driving signal for rotating the display 110 after the first switch 151 was pushed (i.e., after the first switch 151 was turned on) until the first posture and information on a second driving signal for rotating the display 110 after the second switch 152 was pushed (i.e., after the second switch 152 was turned on) until the second posture may be stored in advance. Here, the information on the first driving signal may include information on a signal necessary for pushing the first switch 151 as much as the predetermined first angle, and the information on the second driving signal may include information on a signal necessary for pushing the second switch 152 as much as the predetermined second angle.

Accordingly, as the display 110 in the second posture is rotated to the first posture, when the first switch 151 is pushed, the processor 140 may rotate the display 110 to the first posture based on the prestored information on the first driving signal after the first switch 151 was pushed. Likewise, as the display 110 in the first posture is rotated to the second posture, when the second switch 152 is pushed, the processor 140 may rotate the display 110 to the second posture based on the prestored information on the second driving signal after the second switch 152 was pushed.

The memory 160 may store an operating system (OS) for controlling the overall operations of the components of the display apparatus 100 and instructions or data related to the components of the display apparatus 100.

Accordingly, the processor 140 may control a plurality of hardware or software components of the display apparatus 100 by using various instructions or data stored in the memory 160, and load instructions or data received from at least one of different components on a volatile memory and process them, and store various data in a non-volatile memory.

In particular, the memory 160 may store information on a driving signal for rotating the display 110 to the first posture after the first switch 151 is pushed and information on a driving signal for rotating the display 110 to the second posture after the second switch 152 is pushed. Also, the memory 160 may store information on a threshold value for identifying whether the display 110 collided with an object.

The communicator 170 may perform communication with various electronic apparatuses according to various types of communication methods.

For this, the communicator 170 may include at least one communication module of a near field wireless communication module (not shown) and a wireless LAN communication module (not shown). Here, a near field wireless communication module (not shown) is a communication module performing data communication with an external electronic apparatus located in a near distance wirelessly, and it may be, for example, a Bluetooth module, a Zigbee module, a near field communication (NFC) module, etc. Meanwhile, a wireless LAN communication module (not shown) is a module that is connected to an external network according to a wireless communication protocol such as WiFi and IEEE, etc., and performs communication.

In addition to the above, the communicator 170 may further include a mobile communication module that performs communication by connecting to a mobile communication network according to various mobile communication standards such as 3rd Generation (3G), 3rd Generation Partnership Project (3GPP), Long Term Evolution (LTE), 5th Generation (5G), and the like. Also, the communicator 170 may include at least one of wired communication modules (not shown) such as a Universal Serial Bus (USB), Institute of Electrical and Electronics Engineers (IEEE) 1394, RS-232, etc., and may include a broadcast receiving module that receives TV broadcast.

In particular, the communicator 170 may receive a user instruction for rotating the display apparatus 100 from an electronic apparatus such as a smartphone. For example, in case a user instruction for rotating the display apparatus 100 is input through the screen of a smartphone, the communicator 170 may receive a user instruction for rotating the display apparatus 100 from the smartphone.

The display apparatus 100 may be provided with various kinds of broadcast services, Internet services, etc. from electronic apparatuses through the communicator 170, and may communicate with a smartphone or a laptop computer, etc. in its surroundings, and may be connected with media apparatuses such as a sound bar.

The video processor 180 is a component that processes an image signal including an image frame received through the communicator 170. At the video processor 180, various kinds of image processing such as decoding, scaling, noise filtering, frame rate conversion, resolution conversion, etc. for an image signal may be performed. An image frame processed as above may be displayed on the display 110.

The audio processor 190 is a component that processes an audio signal received through the communicator 170. At the audio processor 190, various kinds of processing such as decoding or amplification, noise filtering, etc. for an audio signal may be performed. An audio signal processed at the audio processor 190 may be output through an audio outputter (not shown).

The audio outputter (not shown) is a component that outputs various kinds of audio signals, various kinds of notification sounds or voice messages processed at the audio processor 190, and it may be implemented as a speaker, etc. In particular, when the display 110 collides with an object, the audio outputter may output a warning sound notifying collision.

The user inputter 195 may receive inputs of various kinds of user instructions for controlling the operations of the display apparatus 100. In particular, the user inputter 195 may receive inputs of user instructions for rotating the display 110.

For this, the user inputter 195 may be implemented as various input devices that can control the display apparatus 100 such as various kinds of buttons or a touch sensor, etc. Also, as a user instruction may be received through an external remote control, the user inputter 195 may include a remote control signal receiver.

Figure 10:
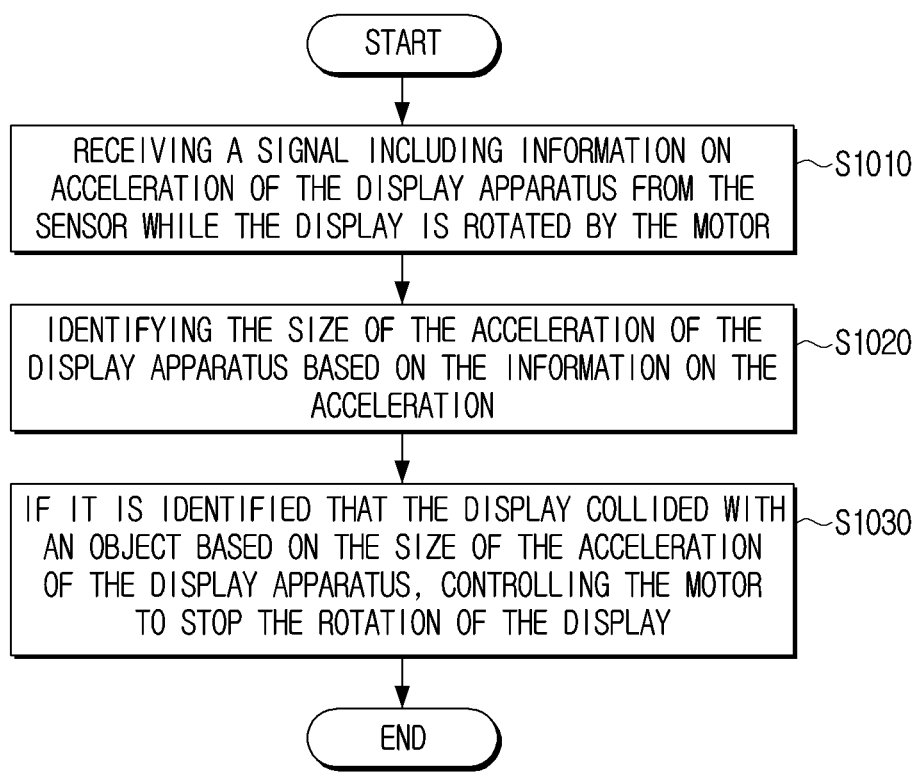
FIG. 10 is a flow chart for illustrating an operation of a display apparatus according to an embodiment of the disclosure.

FIG. 10 is a flow chart for illustrating an operation of a display apparatus according to an embodiment of the disclosure.

The display apparatus 100 may receive a signal including information on acceleration of the display apparatus 100 from the sensor 130 while the display 110 is rotated by the motor 120 at operation S1010.

As an example, the sensor 130 may be implemented as a three-axis acceleration sensor, and in this case, the display apparatus 100 may receive a signal including information on a plurality of accelerations of different axes from the sensor 130.

Then, the display apparatus 100 may identify the size of the acceleration of the display apparatus 100 based on the information on the acceleration of the display apparatus 100 at operation S1020.

As an example, in case a signal including information on a plurality of accelerations of different axes is received from the sensor 130, the display apparatus 100 may identify the size of the acceleration of the display apparatus 100 based on the sizes of each of the plurality of accelerations.

Then, if it is identified that the display 110 collided with an object based on the size of the acceleration of the display apparatus 100, the display apparatus 100 may control the motor 120 to stop the rotation of the display 110 at operation S1030.

Specifically, if it is identified that the size of the acceleration of the display apparatus 100 is greater than or equal to a threshold value, the display apparatus 100 may identify that the display collided with an object.

Alternatively, the display apparatus 100 may generate a signal corresponding to the size of the acceleration of the display apparatus 100 based on the information on the acceleration received from the sensor 130, filter the generated signal through a low pass filter, and if it is identified that the output value of the filtered signal is greater than or equal to a threshold value, the display apparatus 100 may identify that the display 110 collided with an object.

Then, if it is identified that the display 110 collided with an object, the display apparatus 100 may control the motor 120 to stop the rotation of the display 110, and rotate the display 110 to the original state, or display a UI for restoring the display 110 to the original state and a UI for keeping rotating the display 110 on the display 110.

Meanwhile, the methods according to the aforementioned various embodiments of the disclosure may be implemented in forms of software or applications that can be installed on conventional display apparatuses.

Also, the methods according to the aforementioned various embodiments of the disclosure may be implemented just by software upgrade, or hardware upgrade for conventional display apparatuses.

In addition, the aforementioned various embodiments of the disclosure may be performed through an embedded server provided on a display apparatus, or an external server of a display apparatus.

Meanwhile, a non-transitory computer readable medium storing a program that sequentially performs a control method of a display apparatus according to the disclosure may be provided.

A non-transitory computer readable medium refers to a medium that stores data semi-permanently, and is readable by machines, but not a medium that stores data for a short moment such as a register, a cache, and a memory. Specifically, the aforementioned various applications or programs may be provided while being stored in non-transitory computer readable media such as a CD, a DVD, a hard disc, a blue-ray disc, a USB, a memory card, a ROM and the like.

Also, while preferred embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Further, it is intended that such modifications are not to be interpreted independently from the technical idea or prospect of the disclosure.

What is claimed is:

1. A display apparatus comprising:
   a display;
   a motor;
   a sensor; and
   a processor configured to:
      receive a signal including information associated with acceleration of the display apparatus from the sensor, the information associated with the acceleration including a signal corresponding to the acceleration of each of a plurality of axis per unit time based on sensing by the sensor during a time interval while the display is being rotated by the motor,
      based on the signal, identify a differential signal corresponding to each axis based on a change in value of the acceleration of each axis, calculate Norm value based on the differential signal, and identify the Norm value as an amount of the acceleration of the display apparatus, and
      identify whether the display collided with an object based on the amount of the acceleration of the display apparatus, and
      based on identifying that the display collided with the object, control the motor to stop rotation of the display.

2. The display apparatus of claim 1, wherein the processor is configured to:
   identify that the display collided with the object based on identifying that the amount of the acceleration of the display apparatus is greater than or equal to a threshold value.

3. The display apparatus of claim 1, wherein the processor is configured to:
   generate a signal corresponding to the amount of the acceleration of the display apparatus based on the information associated with the acceleration received from the sensor, filter the signal through a low pass filter and generate a filtered signal, and based on identifying that an output value of the filtered signal is greater than or equal to a threshold value, identify that the display collided with the object.

4. The display apparatus of claim 3, wherein the low pass filter blocks a signal having a higher frequency than a cutoff frequency, and
   the cutoff frequency is set as a frequency of a signal output as impact irrelevant to the rotation of the display which is applied to the display apparatus in a signal corresponding to the amount of the acceleration of the display apparatus generated based on a signal received from the sensor while the display does not rotate.

5. The display apparatus of claim 4, wherein the signal corresponding to the amount of the acceleration of the display apparatus generated while the display does not rotate is filtered by the low pass filter, and
   the threshold value is set as a value higher than a maximum output value of the filtered signal.

6. The display apparatus of claim 1, wherein the sensor is included in a body part of the display apparatus, and generates the signal based on a movement of the body part generated by the rotation of the display or collision between the display and the object.

7. The display apparatus of claim 1, wherein the processor is configured to:
   based on identifying that the display collided with the object, control the motor to stop the display from being rotated by the motor, and rotate the display to an original state, or display a user interface (UI) to restore the display to the original state and a UI for keeping rotating the display on the display.

8. The display apparatus of claim 1, wherein the processor is configured to:
   receive a signal including information associated with an angular velocity of the display apparatus from the sensor while the display is rotated by the motor, identify the amount of the angular velocity of the display apparatus based on the information associated with the angular velocity, and based on identifying that the display collided with the object based on the amount of the angular velocity of the display apparatus, control the motor to stop the display from being rotated.

9. A control method of a display apparatus, comprising:
   receiving a signal including information associated with acceleration of the display apparatus from a sensor, the information associated with the acceleration including a signal corresponding to the acceleration of each of a plurality of axis per unit time based on sensing by the sensor during a time interval while a display of the display apparatus is being rotated by a motor;
   identifying an amount of the acceleration of the display apparatus in each axis based on the information associated with the acceleration;
   identifying whether the display collided with an object based on the amount of the acceleration of the display apparatus; and
   based on identifying that the display collided with the object, controlling the motor to stop the display from being rotated by the motor,
   wherein the identifying the amount of the acceleration of the display apparatus comprises:
      based on the signal, generating a differential signal corresponding to each axis based on a change in value of the acceleration of each axis,
      calculating Norm value based on the differential signal; and
      identifying the Norm value as an amount of the acceleration of the display apparatus.

10. The control method of claim 9, further comprising:
    identifying that the display collided with the object based on identifying that the amount of the acceleration of the display apparatus is greater than or equal to a threshold value.

11. The control method of claim 9, further comprising:
    generating a signal corresponding to the amount of the acceleration of the display apparatus based on the information associated with the acceleration received from the sensor, filtering the signal through a low pass filter and generate a filtered signal, and based on identifying that an output value of the filtered signal is greater than or equal to a threshold value, identifying that the display collided with the object.

12. The control method of claim 11,
wherein the low pass filter blocks a signal having a higher frequency than a cutoff frequency, and
the cutoff frequency is set as a frequency of a signal output as impact irrelevant to rotation of the display which is applied to the display apparatus in a signal corresponding to the amount of the acceleration of the display apparatus generated based on a signal received from the sensor while the display does not rotate.

13. The control method of claim 12,
wherein the signal corresponding to the amount of the acceleration of the display apparatus generated while the display does not rotate is filtered by the low pass filter, and
the threshold value is set as a value higher than a maximum output value of the filtered signal.

14. The control method of claim 9, wherein the sensor is included in a body part of the display apparatus, and generates the signal based on a movement of the body part generated by rotation of the display or collision between the display and the object.

15. The control method of claim 9, further comprising:
based on identifying that the display collided with the object, controlling the motor to stop rotation of the display, and rotate the display to an original state, or displaying a UI for restoring the display to the original state and a UI for keeping rotating the display on the display.

16. The control method of claim 9, further comprising:
receiving a signal including information associated with an angular velocity of the display apparatus from the sensor while the display is rotated by the motor, identifying the amount of the angular velocity of the display apparatus based on the information associated with the angular velocity, and based on identifying that the display collided with the object based on the amount of the angular velocity of the display apparatus, controlling the motor to stop the display from being rotated by the motor.

* * * * *